United States Patent
Park et al.

(10) Patent No.: US 12,417,379 B2
(45) Date of Patent: Sep. 16, 2025

(54) NEURON AND NEUROMORPHIC SYSTEM INCLUDING THE NEURON

(71) Applicant: IUCF-HYU (Industry-University Cooperation Foundation Hanyang University), Seoul (KR)

(72) Inventors: Jea Gun Park, Seongnam-si (KR); Jong Ung Baek, Seongnam-si (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 1085 days.

(21) Appl. No.: 17/416,765

(22) PCT Filed: Nov. 7, 2019

(86) PCT No.: PCT/KR2019/015038
§ 371 (c)(1),
(2) Date: Jun. 21, 2021

(87) PCT Pub. No.: WO2020/130344
PCT Pub. Date: Jun. 25, 2020

(65) Prior Publication Data
US 2022/0076108 A1    Mar. 10, 2022

(30) Foreign Application Priority Data
Dec. 19, 2018    (KR) .......................... 10-2018-0165711

(51) Int. Cl.
G06N 3/063    (2023.01)
H10D 30/00    (2025.01)

(52) U.S. Cl.
CPC ............. *G06N 3/063* (2013.01); *H10D 30/00* (2025.01)

(58) Field of Classification Search
CPC ............................... G06N 3/063; H10D 30/00
See application file for complete search history.

(56) References Cited

U.S. PATENT DOCUMENTS

2014/0214738 A1    7/2014    Pickett
2018/0068217 A1*    3/2018    Eleftheriou ............ G06N 3/049

FOREIGN PATENT DOCUMENTS

JP    10-2017-0138047 A    12/2017
KR    10-2016-0019682 A    2/2016
(Continued)

OTHER PUBLICATIONS

B. Rajendran and F. Alibart, "Neuromorphic Computing Based on Emerging Memory Technologies," in IEEE Journal on Emerging and Selected Topics in Circuits and Systems, vol. 6, No. 2, pp. 198-211, Jun. 2016, doi: 10.1109/JETCAS.2016.2533298 (Year: 2016).*

(Continued)

*Primary Examiner* — Kamran Afshar
*Assistant Examiner* — Simon Fischer Ellis
(74) *Attorney, Agent, or Firm* — Sughrue Mion, PLLC

(57) ABSTRACT

The present invention discloses a neuron and a neuromorphic system including the same. The neuron according to an embodiment of the present invention includes a two-terminal spin device for performing integration and fire, and the two-terminal spin device is formed to have a negative differential resistance (NDR) region in which current decreases as voltage increases.

10 Claims, 23 Drawing Sheets

(56) References Cited

FOREIGN PATENT DOCUMENTS

| KR | 10-2016-0112889 A | 9/2016 |
| KR | 10-1727546 B1 | 5/2017 |
| KR | 10-2018-0093687 A | 8/2018 |

OTHER PUBLICATIONS

X. Fong, Y. Kim, R. Venkatesan, S. H. Choday, A. Raghunathan and K. Roy, "Spin-Transfer Torque Memories: Devices, Circuits, and Systems, " in Proceedings of the IEEE, vol. 104, No. 7, pp. 1449-1488, Jul. 2016, doi: 10.1109/JPROC.2016.2521712 (Year: 2016).*

Masquelier, Timothée, and Simon J. Thorpe. "Unsupervised learning of visual features through spike timing dependent plasticity." PLoS computational biology 3, No. 2 (2007): e31. (Year: 2007).*

Sengupta, Abhronil, Aparajita Banerjee, and Kaushik Roy. "Hybrid spintronic-CMOS spiking neural network with on-chip learning: Devices, circuits, and systems." Physical Review Applied 6, No. 6 (2016): 064003 (Year: 2016).*

Mrigank Sharad, et al., "Proposal for Neuromorphic Hardware Using Spin Devices", Purdue University, Jun. 2012, p. 1-8.

International Search Report for PCT/KR2019/015038 dated Feb. 18, 2020 [PCT/ISA/210].

Written Opinion for PCT/KR2019/015038 dated Feb. 18, 2020 [PCT/ISA/237].

Korean Notice of Allowance for 10-2018-0165711 dated Feb. 5, 2021.

\* cited by examiner

100a

100b

400

NEURON AND NEUROMORPHIC SYSTEM INCLUDING THE NEURON

CROSS-REFERENCE TO RELATED APPLICATION

This application is a National Stage Entry of PCT International Application No. PCT/KR2019/015038, which was filed on Nov. 7, 2019, and claims priority to Korean Patent Application No. 10-2018-0165711, filed on Dec. 19, 2018 in the Korean Intellectual Property Office, the disclosure of which is incorporated herein by reference.

TECHNICAL FIELD

The present invention relates to a neuron and a neuromorphic system including the same. More particularly, the present invention relates to a neuron capable of reducing power consumption to 0.06 mW by including a two-terminal spin device for performing integration and fire; and a neuromorphic system including the neuron.

BACKGROUND ART

In recent years, attempts have been made to develop a circuit that imitates an animal's nervous system to overcome problems in a von Neumann architecture-based integrated circuit, such as excessive power consumption and heat generation. In particular, techniques that imitate an animal's nervous system may improve cognitive and judgmental capabilities by enabling cognitive and learning functions while significantly reducing power consumption. In addition, such an animal neural network imitation technique may replace or greatly improve the function of a von Neumann architecture-based integrated circuit. Therefore, there is growing interest in such a technique, and research on the technique is being actively conducted.

A neuromorphic system may be implemented using the mechanisms of action of nerve cells. The neuromorphic system refers to a system that imitates the processing of data in the brain by implementing a neuron that constitutes the human brain using a plurality of devices. Thus, using a neuromorphic system including a neuron, data may be processed and learning may be performed in a manner similar to the brain.

That is, a neuron may be connected to the other neuron via the synapses of the neuron and may receive data from the other neuron via the synapses. In this case, the neuron integrates the received data, and outputs the data by firing the data when the data exceeds a critical value ($V_t$). That is, the neuron has a function of integrating and firing of data. In addition, a synaptic device selectively outputs data according to an input value. That is, the synaptic device potentiates or depresses input data and transmits the data to the neuron.

Conventionally, a neuron was fabricated on the basis of C-MOSFETs. The C-MOSFET-based neuron includes a capacitor configured to integrate data and a comparator configured to fire data when a signal above a critical value is applied, and further includes a delay and additional circuits to ensure stability.

However, since the capacitor occupies a fairly large area, the total area of the neuron is greatly increased, and power consumption is also greatly increased. The capacitor is useful for simulating change in the membrane potential of a biological neuron, but when the capacitor has a small capacity, an electric charge cannot be accumulated due to leakage current. In general, an RC time constant required for a neuron to operate is about a few milliseconds. To obtain the RC time constant value, a capacity of at least several hundred pF is required even when a high resistance of several tens of M ohm is used. However, since current technology requires an area of 1,000 $F^2$ or more to implement this level of capacity, capacitor-based neurons have difficulty in implementing highly integrated artificial intelligence hardware.

Therefore, due to this structural limitation, the neuromorphic system has various problems such as complex configuration and low precision.

DISCLOSURE

Technical Problem

Therefore, the present invention has been made in view of the above problems, and it is one object of the present invention to provide a neuron having an improved degree of integration without a capacitor by including a two-terminal spin device.

It is another object of the present invention to provide a neuron capable of significantly reducing power consumption to 0.06 mW by including a two-terminal spin device for performing integration and fire.

It is yet another object of the present invention to provide a neuromorphic system including a neuron including a two-terminal spin device for performing integration and fire. The neuromorphic system of the present invention may be applied to an artificial intelligence system capable of performing learning and logical thinking.

Technical Solution

In accordance with one aspect of the present invention, provided is a neuron including a two-terminal spin device for performing integration and fire, wherein the two-terminal spin device is formed to have a negative differential resistance (NDR) region in which current decreases as voltage increases.

The integration may be a process in which an electrical signal (input spikes) input through one or more synapses is integrated in a form of a potential.

When voltage is applied to the two-terminal spin device, the two-terminal spin device gradually transitions from a low-resistance state to a high-resistance state, allowing the integration to be performed.

The voltage may be in a form of a pulse.

The fire may be a process in which the accumulated potential reaches a threshold and an electrical signal (output spikes) is output to adjacent neurons.

The two-terminal spin device may perform the integration, and may perform the fire when resistance reaches threshold resistance (Rth).

The two-terminal spin device may include a bottom electrode, a seed layer, a pinning layer, a pinned layer, a tunnel barrier layer, a free layer, and a top electrode.

In accordance with another aspect of the present invention, provided is a neuromorphic system including one or more pre-neurons; one or more synapses electrically connected to the pre-neurons; and one or more post-neurons electrically connected to the synapses and each including a two-terminal spin device, wherein the post-neurons perform integration and fire.

The two-terminal spin device may be formed to have a negative differential resistance (NDR) region in which current decreases as voltage increases.

The synapses may have a cross-bar array structure.

Each of the synapses may include a memristor and a selection device.

The neuromorphic system may further include a controller.

The controller may be configured to reset the post-neurons.

Advantageous Effects

According to one embodiment, the present invention can provide a neuron having an improved degree of integration without a capacitor by including a two-terminal spin device.

According to one embodiment, the present invention can provide a neuron capable of significantly reducing power consumption to 0.06 mW by including a two-terminal spin device for performing integration and fire.

According to one embodiment, the present invention can provide a neuromorphic system including a neuron including a two-terminal spin device for performing integration and fire. The neuromorphic system of the present invention can be applied to an artificial intelligence system capable of performing learning and logical thinking.

BEST MODE

Figure 1A:
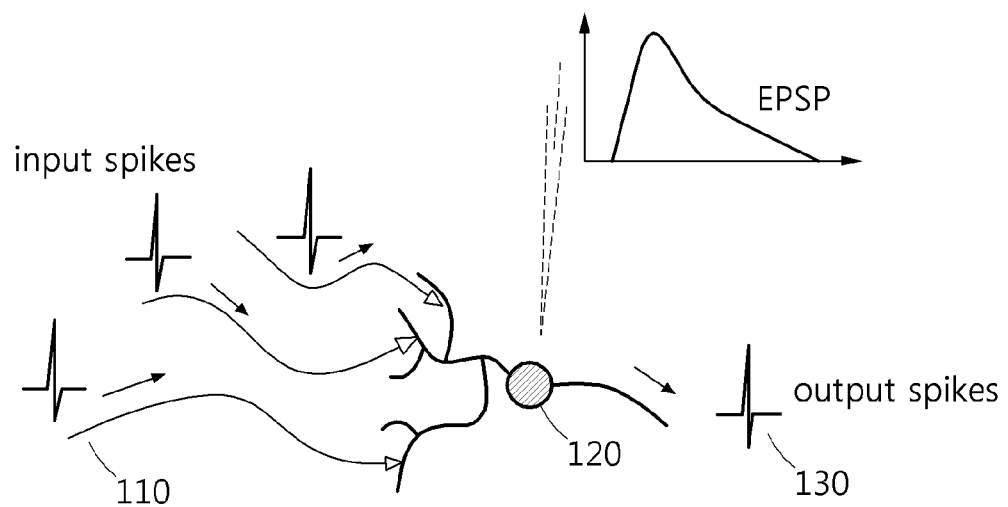
FIGS. 1A and 1B are a schematic diagram illustrating a neuron and a leaky integration and fire (LIF) operation and a graph showing the leaky integration and fire (LIF) operation.

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless mentioned otherwise or clearly inferred from context, the expression "x uses a or b" means any one of natural inclusive permutations.

In addition, as used in the description of the disclosure and the appended claims, the singular form "a" or "an" is intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless defined otherwise, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

In addition, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Figure 1B:
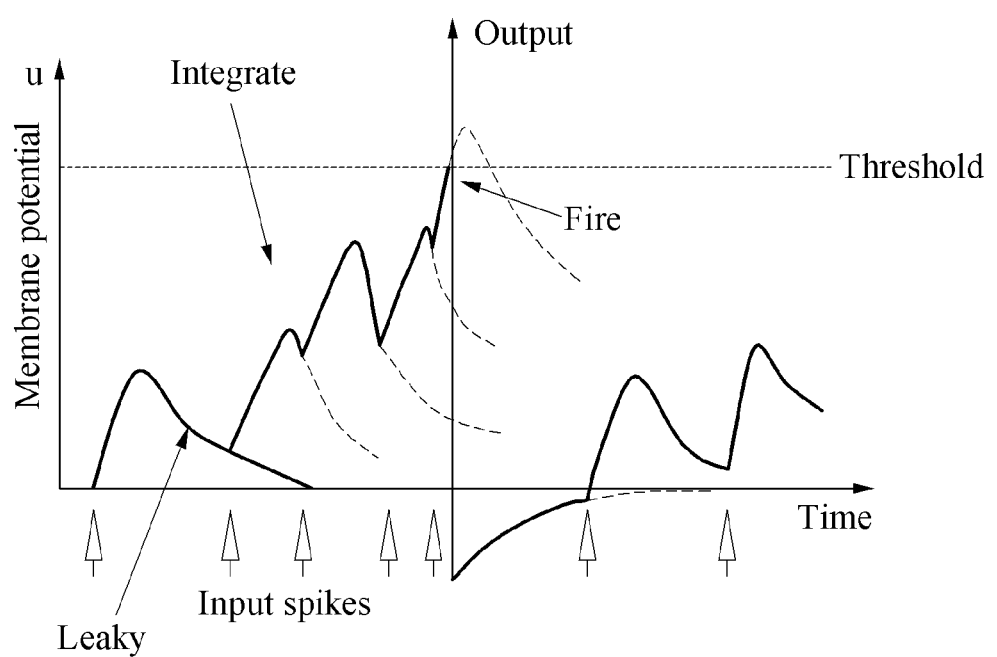

FIGS. 1A and 1B are a schematic diagram illustrating a neuron and a leaky integration and fire (LIF) operation and a graph showing the leaky integration and fire (LIF) operation. Referring to the schematic diagram and an LIF graph 100b of FIGS. 1A and 1B, in a neural network 100a, when an electrical signal is input through synapses 110 and 130, a neuron 120 may perform an LIF operation to integrate the electrical signal (input spikes) transmitted from the adjacent neuron 120 in the form of the membrane potential of the neuron 120. When the membrane potential reaches a specific threshold, the neuron 120 may perform fire to transmit the electrical signal (output spikes) to the adjacent neuron 120.

However, conventionally, a complementary metal oxide semiconductor (CMOS) device-based neuron has been used as the neuron 120. Accordingly, a capacitor was indispensable to imitate integration occurring in a neural network.

A capacitor stores an electrical signal input to the neuron 120 in the form of an electric charge, and the stored electric charge causes a potential difference at both ends of the capacitor. A neuron circuit detects the potential difference. At this time, when the potential difference exceeds a certain value, the neuron circuit judges that fire has been performed, and transmits the electrical signal to the adjacent neuron 120.

Such a capacitor may be usefully used to imitate change in the membrane potential of a biological neuron. However, when the capacitor has a small capacity, it is impossible to integrate an electric charge due to leakage current.

In general, an RC time constant required for the neuron 120 to operate is about several milliseconds. To obtain the RC time constant value, even when a high resistance of several tens of M ohm is used, a capacity of at least several hundred pF is required. To realize a capacity of at least several hundred pF, an area of 1,000 $F^2$ or more is required. Accordingly, it is difficult to implement artificial intelligence hardware that requires high integration using a neuron including a capacitor.

Hereinafter, a neuron according to an embodiment of the present invention will be described.

Figure 2:
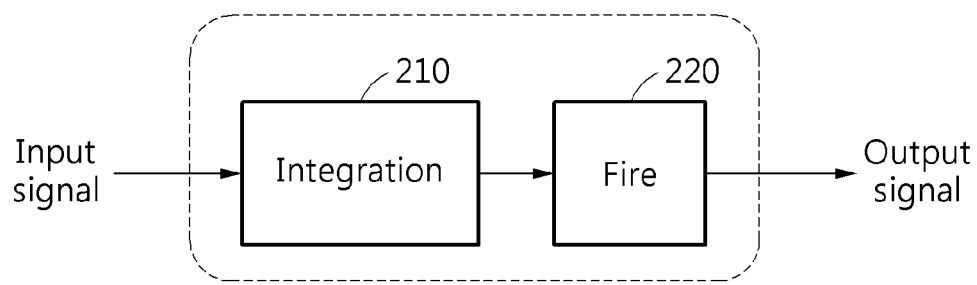
FIG. 2 is a block diagram showing a neuron according to an embodiment of the present invention.

FIG. 2 is a block diagram showing a neuron according to an embodiment of the present invention.

A neuron 200 according to an embodiment of the present invention includes a two-terminal spin device for performing integration 210 and fire 220, and the two-terminal spin device is formed so as to have a negative differential resistance (NDR) region in which current decreases as voltage increases.

Specifically, the two-terminal spin device may include two or more resistance states that are distinct from each other and are electrically reversible, and the I-V curve of the two-terminal spin device may be provided with a region in which current decreases as voltage increases.

Accordingly, an NDR region in which current gradually decreases as voltage increases may appear in the two-terminal spin device. When voltage is applied to the NDR region, the two-terminal spin device may transition from a low-resistance state to a high-resistance state.

The neuron 200 according to an embodiment of the present invention may be electrically connected to one or more synapses, and an electrical signal (input spikes) input through the synapses may be integrated in the form of potential to perform the integration 210.

Preferably, since the neuron 200 according to an embodiment of the present invention includes the two-terminal spin device, when voltage is applied to the two-terminal spin device through one or more synapses, the two-terminal spin device may gradually transition from a low-resistance state to a high-resistance state, so that the integration 210 is performed.

In this case, the voltage input to the neuron 200 according to an embodiment of the present invention may be in the form of a pulse. That is, when pattern data is input, an input neuron for inputting data to the neuron 200 according to an embodiment of the present invention may transmit a pulse corresponding to the pattern data to one or more synapses, and current may be input to the neuron 200 according to an embodiment of the present invention through the synapses having different weights.

In addition, in the neuron 200 according to an embodiment of the present invention, the pulses of input voltage may be applied repeatedly or randomly.

In an actual neural network, when a neuron operates, a pulse having a random size or interval is input to the neuron rather than a pulse having a constant size or interval. Since the neuron 200 according to an embodiment of the present invention includes the two-terminal spin device, even when pulses are applied randomly, the neuron 200 may act as a neuron.

When the pulses of voltage input to the neuron 200 according to an embodiment of the present invention are repeatedly applied, the characteristics of the neuron 200 according to an embodiment of the present invention may be controlled according to pulse parameters such as the pulse amplitude or pulse width of input voltage.

For example, when the pulse amplitude of a voltage input to the neuron 200 according to an embodiment of the present invention is too large, breakdown may occur in the tunnel barrier layer of the two-terminal spin device, integration characteristics disappear, and characteristics of being fired immediately are exhibited. On the contrary, when the pulse amplitude is too small, integration characteristics disappear, and thus fire characteristics also disappear.

As the amplitude of the pulse of voltage input to the neuron 200 according to an embodiment of the present invention increases, change in potential increases. Conversely, as the amplitude of the pulse decreases, change in potential decreases.

In addition, upon driving, the amplitude of a pulse input to the neuron 200 according to an embodiment of the present invention may be determined according to the synaptic weight of one or more synapses connected to the neuron 200 according to an embodiment of the present invention.

When the synaptic weight of one or more synapses connected to the neuron 200 according to an embodiment of the present invention increases, the amplitude of a pulse applied toward the synapses increases. On the contrary, when the synaptic weight decreases, the amplitude of a pulse applied toward the synapses decreases.

Since the neuron 200 according to an embodiment of the present invention needs to react more sensitively to a pulse input from one or more synapses having a large synaptic weight, when a large input pulse is input to the neuron 200 according to an embodiment of the present invention, change in potential increases.

Accordingly, when too high voltage is applied to the neuron 200 according to an embodiment of the present invention, there is a problem in that the neuron 200 according to an embodiment of the present invention reaches threshold resistance (Rth) by a single pulse. When too low voltage is applied to the neuron 200 according to an embodiment of the present invention, there is a problem in that resistance change does not occur.

The pulse width of a voltage input to the neuron 200 according to an embodiment of the present invention does not significantly affect the characteristics of the neuron 200. Since time required to switch the spin of the two-terminal spin device included in the neuron 200 according to an embodiment of the present invention is several ns, a time in usec or msec has no effect on the characteristics of the neuron 200 according to an embodiment of the present invention.

Since the neuron 200 according to an embodiment of the present invention does not perform leakage, the interval of an input pulse does not significantly affect operation.

In addition, when potential accumulated in the neuron 200 according to an embodiment of the present invention reaches a threshold value, the neuron 200 may perform the fire 220 to output an electrical signal (output spikes) to an adjacent neuron.

Preferably, when the two-terminal spin device performs integration and resistance reaches threshold resistance (Rth), the fire 220 may be performed. In this case, threshold resistance (Rth) may be 20Ω to 30Ω, without being limited thereto.

The range of threshold resistance may be determined within a range in which the neuron 200 according to an embodiment of the present invention operates at maximum thereof.

As the threshold resistance of the neuron 200 according to an embodiment of the present invention increases, the precision (rate of judging falsehood as falsehood) of a neural network increases, but the reproducibility (rate of judging truth as truth) thereof decreases. Thus, there is a trade-off between precision and reproducibility. Accordingly, it is important to set an appropriate threshold resistance value.

In this case, the appropriate threshold resistance value may be selected according to the purpose of use of the neural network. For example, when precision is important, a high threshold resistance value may be required, and when reproducibility is important, a low threshold resistance value may be required.

Accordingly, since the neuron 200 according to an embodiment of the present invention includes the two-terminal spin device for performing the integration 210 and the fire 220, power consumption may be significantly reduced to 0.06 mW.

In addition, since the neuron 200 according to an embodiment of the present invention includes the two-terminal spin device for performing the integration 210 and the fire 220, the neuron 200 may be applied to an artificial intelligence system capable of performing learning and logical thinking.

The two-terminal spin device included in the neuron 200 according to an embodiment of the present invention may include a bottom electrode, a seed layer, a pinning layer, a pinned layer, a tunnel barrier layer, a free layer, and a top electrode. The structure of the two-terminal spin device included in the neuron 200 according to an embodiment of the present invention will be described in detail with reference to FIGS. 3A and 3B.

Figure 3A:
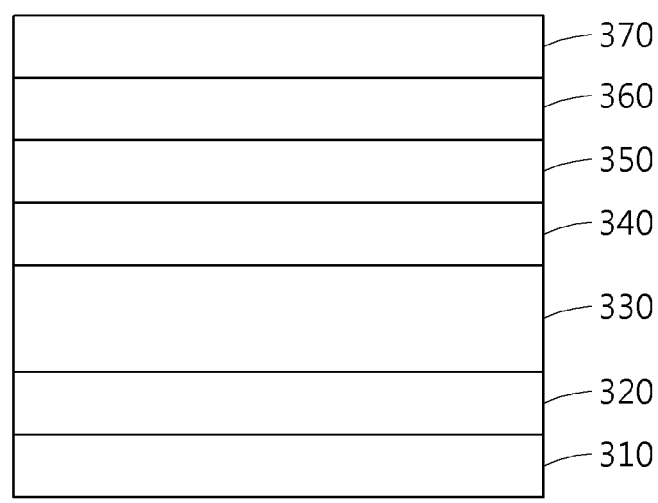
FIGS. 3A and 3B are cross-sectional views of a two-terminal spin device included in the neuron according to an embodiment of the present invention.
Figure 3B:
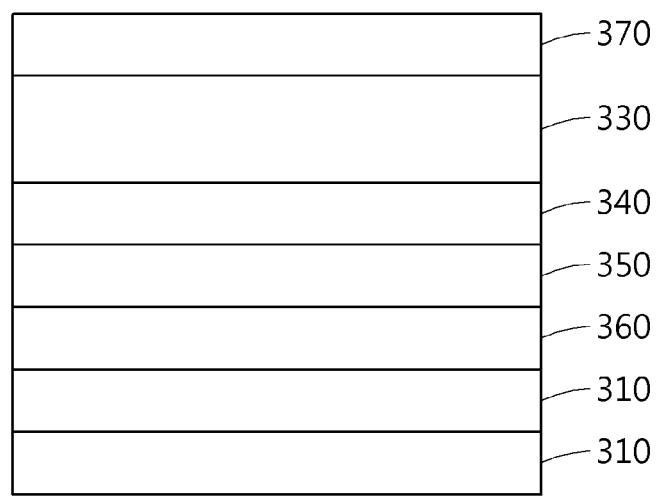

FIGS. 3A and 3B are cross-sectional views of a two-terminal spin device included in the neuron according to an embodiment of the present invention.

FIG. 3A illustrates a two-terminal spin device having an upper free layer structure, FIG. 3B illustrates a two-terminal spin device having a lower free layer structure. In FIGS. 3A and 3B, the positons of the free layers of the two-terminal spin devices are different, but the two-terminal spin devices have the same components. Thus, repeated description thereof will be omitted.

Each of the two-terminal spin device 300a and 300b included in the neuron according to an embodiment of the present invention may include a bottom electrode 310, a seed layer 320, a pinning layer 330, a pinned layer 340, a tunnel barrier layer 350, a free layer 360, and a top electrode 370.

The bottom electrode 310 may be formed on a substrate, and may be formed using a conductive material such as metals and metal nitrides. In this case, the bottom electrode 310 may be formed as at least one layer. That is, the bottom electrode 310 may be formed as a single layer or multiple layers. For example, the bottom electrode 310 may have a dual structure consisting of first and second bottom electrodes.

When the bottom electrode 310 is formed as a single layer, the bottom electrode 310 may be formed of a metal nitride, e.g., titanium nitride (TiN), or a metal, e.g., tungsten (W). When the bottom electrodes 310 are formed as double layers, the first bottom electrode may be formed of a metal such as tungsten (W), and the second bottom electrode may be formed of a metal nitride such as titanium nitride (TiN).

In addition, the first bottom electrode may be formed on the substrate, and the second bottom electrode may be formed on the first bottom electrode. In addition, when an insulating layer is formed on the substrate, the first bottom electrode may be formed on the insulating layer, or may be formed inside the insulating layer.

The bottom electrode 310 may be formed of a polycrystal conductive material. For example, the bottom electrode may be formed of a conductive material having a BCC structure.

The seed layer 320 may be formed on the bottom electrode 310, and may be formed of a material that allows crystal growth of a magnetic tunnel junction (MTJ).

The seed layer 320 may include one selected from tantalum (Ta), ruthenium (Ru), titanium (Ti), palladium (Pd), platinum (Pt), magnesium (Mg), cobalt (Co), aluminum (Al), and tungsten (W), or an alloy thereof. Preferably, the seed layer 320 is formed of tantalum (Ta) to have a thickness of 1 nm to 3 nm.

The pinning layer 330 may be formed on the seed layer 320, and may be formed of a ferromagnetic material. The pinned layer 330 is magnetized in one direction in a magnetic field within a predetermined range, and may be formed of a ferromagnetic material. For example, the magnetization may be fixed in a direction from the top to the bottom.

In addition, the pinning layer 330 may be formed using a ferromagnetic material such as a full-Heusler semimetal-based alloy, an amorphous rare-earth element alloy, a multilayer thin film in which a ferromagnetic metal and a nonmagnetic metal are alternately laminated, an alloy having an L10-type crystal structure, or a cobalt-based alloy.

The full-Heusler semimetal-based alloy may include CoFeAl and CoFeAlSi, and the amorphous rare-earth element alloy may include TbFe, TbCo, TbFeCo, DyTbFeCo, and GdTbCo. In addition, the multilayer thin film in which a ferromagnetic metal and a nonmagnetic metal are alternately laminated may include Co/Pt, Co/Pd, CoCr/Pt, Co/Ru, Co/Os, Co/Au, Ni/Cu, CoFeAl/Pd, CoFeAl/Pt, CoFeB/Pd, and CoFeB/Pt.

In addition, the alloy having an L10-type crystal structure may include Fe50Pt50, Fe50Pd50, Co50Pt50, Fe30Ni20Pt50, and Co30Ni20Pt50. In addition, the cobalt-based alloy may include CoCr, CoPt, CoCrPt, CoCrTa, CoCrPtTa, CoCrNb, and CoFeB.

Among these materials, the CoFeB single layer may be formed thicker than the multilayer structure of CoFeB and Co/Pt or Co/Pd, thereby increasing a magnetoresistance ratio. In addition, since CoFeB is easier to etch than Pt or Pd, the manufacturing process of the CoFeB single layer is easier compared to the multilayer structure containing Pt or Pd. In addition, the CoFeB single layer may have both vertical and horizontal magnetizations by adjusting the thickness thereof.

Accordingly, in one embodiment of the present invention, the pinning layer 330 may be formed using a CoFeB single layer, and the CoFeB layer may be formed in an amorphous form and then textured in the BCC (100) direction by heat treatment. In addition, the pinning layer 330 may be formed to have a thickness of 0.5 nm to 1.5 nm.

The pinned layer 340 may include a ferromagnetic material. For example, the pinned layer 340 may include a single layer including a ferromagnetic material. The pinned layer 340 may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3FesO_{12}$.

The tunnel barrier layer 350 may be formed on the pinned layer 340 to separate the pinning layer 330 and the free layer 360. The tunnel barrier layer 350 allows quantum mechanical tunneling between the pinning layer 330 and the free layer 360.

The tunnel barrier layer 350 may be formed of magnesium oxide (MgO), aluminum oxide ($Al_2O_3$), silicon oxide ($SiO_2$), tantalum oxide ($Ta_2O_5$), silicon nitride ($SiN_x$), or aluminum nitride ($AlN_x$).

Preferably, the tunnel barrier layer 350 is formed using polycrystal magnesium oxide, and magnesium oxide is textured in the BCC (100) direction by subsequent heat treatment.

In addition, the tunnel barrier layer 350 may be formed to have the same thickness as the pinning layer 330 or to be thicker than the pinning layer 330. For example, the tunnel barrier layer 350 may be formed to have a thickness of 0.5 nm to 1.5 nm.

The free layer 360 may be formed on the tunnel barrier layer 350. In the free layer 360, the magnetization thereof is not fixed in one direction, and the magnetization may be changed from one direction to the opposite direction. That is, the magnetization directions of the free layer 360 and the pinning layer 330 may be identical (i.e., parallel) or opposite (i.e., antiparallel).

When the magnetization direction of the free layer 360 is antiparallel to that of the pinning layer 330, the resistance of a magnetic tunnel junction may increase.

For example, the free layer 360 may be formed of a ferromagnetic material such as a full-Heusler semimetal-based alloy, an amorphous rare-earth element alloy, a multilayer thin film in which a ferromagnetic metal and a nonmagnetic metal are alternately laminated, or an alloy having an L10-type crystal structure.

In addition, the free layer 360 may have a lamination structure in which a first free layer, an insertion layer, and a second free layer are laminated. That is, the free layer 360 may have a structure in which the first and second free layers are separated from each other by the insertion layer. In this case, the first and second free layers may have the same magnetization direction or different magnetizations. For example, both of the first and second free layers may have a vertical magnetization direction, or the first free layer may have a vertical magnetization direction and the second free layer may have a horizontal magnetization direction. In addition, the insertion layer may be formed of a material having a BCC structure without magnetization. That is, the first free layer may be vertically magnetized, the insertion layer may not be magnetized, and the second free layer may be vertically or horizontally magnetized. In this case, each of the first and second free layers may be formed of CoFeB, and the first free layer may be formed to have a thickness equal to or smaller than that of the second free layer.

In addition, the insertion layer may be formed to be thinner than the first and second free layers. For example, the first and second free layers may be formed of CoFeB to have a thickness of 0.5 nm to 1.5 nm, and the insertion layer may be formed of a material having a BCC structure, e.g., W, to have a thickness of 0.2 nm to 0.5 nm. In this case, the first and second free layers may be formed to have a thickness equal to or smaller than that of the pinning layer 330, and the total thickness of the free layer 360 may be greater than the thickness of the pinning layer 330.

The top electrode 370 may be formed on the free layer 360. The top electrode 370 may be formed using a conductive material such as a metal, a metal oxide, and a metal nitride. For example, the top electrode 370 may be formed of a single metal selected from tantalum (Ta), ruthenium (Ru), titanium (Ti), palladium (Pd), platinum (Pt), magnesium (Mg), and aluminum (Al) or an alloy thereof.

According to an embodiment, the two-terminal spin device may further include at least one of an insulating layer, a buffer layer, a synthetic antiferromagnetic layer, a separation layer, a diffusion barrier layer, and a capping layer, and the positions thereof are not particularly limited.

For example, the buffer layer may be formed of a material having excellent matching with the bottom electrode 310 to resolve a lattice constant mismatch between the bottom electrode 310 and the seed layer 320.

In addition, the synthetic antiferromagnetic layer may be formed to fix the magnetization of the pinning layer 330, and the separation layer may be formed to separate the synthetic antiferromagnetic layer and the pinning layer 330.

In addition, the diffusion barrier layer may be formed to prevent the material of the capping layer from diffusing, and the capping layer may be formed to prevent diffusion of the top electrode 370.

Since the neuron according to an embodiment of the present invention includes the two-terminal spin device, a capacitor is no longer needed, thereby improving degree of integration and reducing power consumption.

Figure 4:
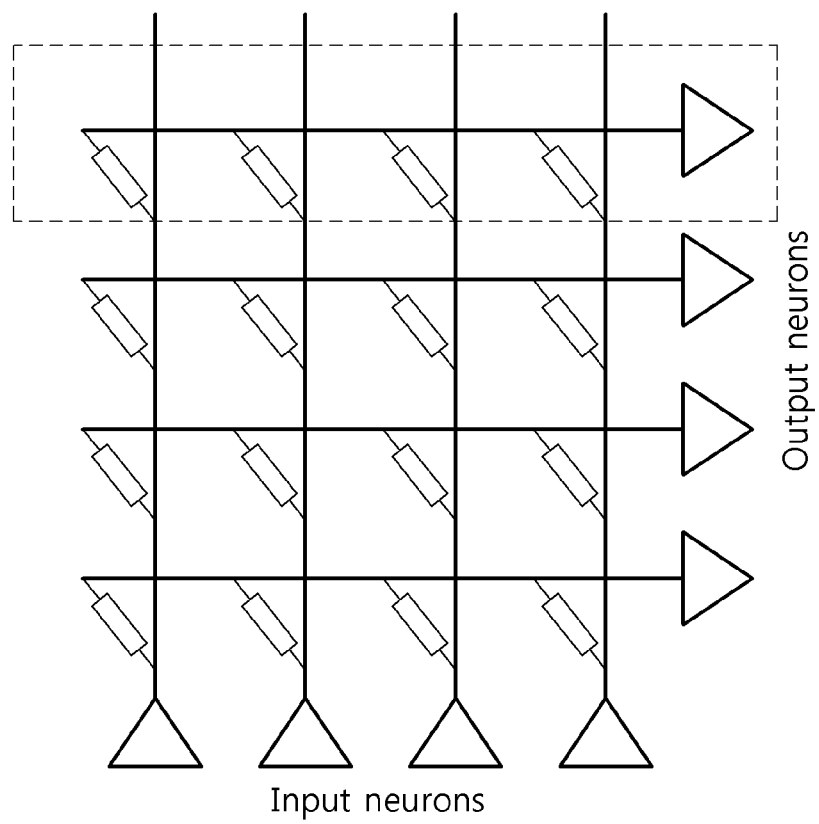
FIG. 4 is a schematic diagram showing the cross-bar array structure of a neuromorphic system according to an embodiment of the present invention.

FIG. 4 is a schematic diagram showing the cross-bar array structure of a neuromorphic system according to an embodiment of the present invention.

In a computer, a central processing unit (CPU) and a memory are separated, and the von Neumann architecture is generally used for data transmission between the CPU and the memory through a bus. The von Neumann architecture has an advantage in that a desired operation can be performed only with software programming without the need to reconfigure hardware according to an operation desired by a user. However, the von Neumann architecture has a disadvantage in that the bandwidth between the CPU and the memory is low.

In particular, deep learning, which has recently been in the spotlight in the field of artificial intelligence, requires large-scale parallel processing. When implementing deep learning in the von Neumann architecture, efficiency in terms of data processing and transmission speed and energy consumption is reduced due to the von Neumann bottleneck.

Accordingly, in fields that require large-scale parallel computations, such as artificial intelligence, the need for efficient and new structured hardware is increasing. A neuromorphic architecture that mimics the human brain has been proposed as an alternative.

Accordingly, in the neuromorphic system according to an embodiment of the present invention, by forming a cross-bar array structure 400, a neural network structure that connects the neurons according to an embodiment of the present invention may be implemented. Accordingly, since operations are executed by interaction between the neurons according to an embodiment of the present invention, artificial intelligence hardware having improved efficiency in terms of data processing and transmission speed and energy consumption may be implemented.

Figure 5:
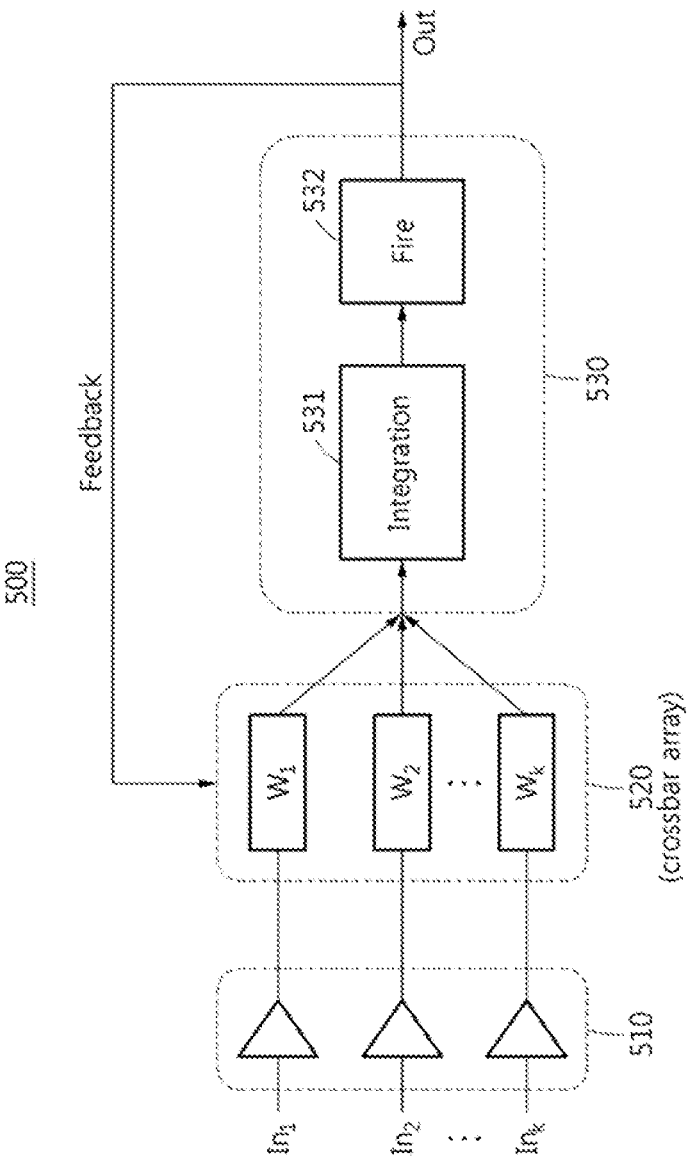
FIG. 5 is a block diagram showing a neuromorphic system according to an embodiment of the present invention.

FIG. 5 is a block diagram showing a neuromorphic system according to an embodiment of the present invention.

Since the neuron according to an embodiment of the present invention is used in one or more pre-neurons 510 and one or more post-neurons 530 included in a neuromorphic system 500 according to an embodiment of the present invention, description of the same components will be omitted.

The neuromorphic system 500 according to an embodiment of the present invention includes the pre-neurons 510, one or more synapses 520 electrically connected to the pre-neurons 510, and the post-neurons 530 electrically connected to the synapses 520 and each including a two-terminal spin device. In this case, the post-neurons 530 perform integration 531 and fire 532.

In describing the neuromorphic system 500 according to an embodiment of the present invention, the pre-neurons 510 and the post-neurons 530 are separately described. However, the pre-neurons 510 may be both the pre-neurons 510 and the post-neurons 530.

For example, when the neuromorphic system according to an embodiment of the present invention includes first to third neurons, in comparison with the first neuron, the second neuron may be the post-neurons 530. In addition, in comparison with the third neuron, the second neuron may be the pre-neurons 510.

The integration 531 is a process in which an electrical signal (input spikes) input from the pre-neurons 510 through the synapses 520 is integrated in the form of potential in the post-neurons 530.

More specifically, when voltage is applied to the two-terminal spin device, the two-terminal spin device gradually transitions from a low-resistance state to a high-resistance state, allowing the post-neurons 530 to perform the integration 531.

The fire 532 is a process in which potential accumulated in the post-neurons 530 reaches a threshold and an electrical signal (output spikes) is output to adjacent post-neurons.

More specifically, when the two-terminal spin device performs the integration 531 and resistance reaches threshold resistance (Rth), the post-neurons 530 may perform the fire 532.

In addition, the neuromorphic system 500 according to an embodiment of the present invention may further include a controller.

The controller included in the neuromorphic system according to an embodiment of the present invention may reset the post-neurons 530.

Since the post-neurons 530 included in the neuromorphic system 500 according to an embodiment of the present invention do not operate alone, the controller is required for the pre-neurons 510 and the post-neurons 530 to interact with each other.

For example, assuming that the post-neurons 530 have been fired, the controller may detect a signal from the output terminal of the post-neurons 530, and may perform an operation (i.e., winner takes all operation) of preventing neurons other than the fired post-neurons 530 from being fired.

Alternatively, assuming that the post-neurons 530 have been fired, the controller may detect the operation, and may send a reset signal to the fired post-neurons 530 on the next operation to reset the potential of the fired post-neurons 530.

Reset may be performed through a circuit configuration, and a resistance value may be reset by applying a large pulse having a polarity opposite to the polarity of a pulse applied when the post-neurons 530 are integrated. Since it is difficult for the post-neurons 530 to perform these operations alone, the controller may be separately disposed to manage these operations.

In addition, the neuromorphic system 500 according to an embodiment of the present invention may further include an adder. The adder may perform calculations using circuit equations.

When several input signals are simultaneously applied to the post-neurons 530, the adder may sum these signals and input this value to the post-neurons 530. In general, in a neural network composed of LIF neurons, since only one neuron is fired in one layer (winner takes all function), multiple inputs are not input at the same time. However, there may also be a neural network that does not use the function (winner takes all function). In this case, since simultaneously transmitted input signals need to be summed, the adder may be required according to an embodiment.

The synapses 520 may have a cross-bar array structure, and each of the synapses may include a memristor and a selection device.

Since the synapses 520 included in the neuromorphic system 500 according to an embodiment of the present invention include a selection device, the synapses 520 having a cross-bar array structure may suppress sneak current.

The memristor and the selection device included in the synapses 520 will be described with reference to FIGS. 6 and 7.

Figure 6:
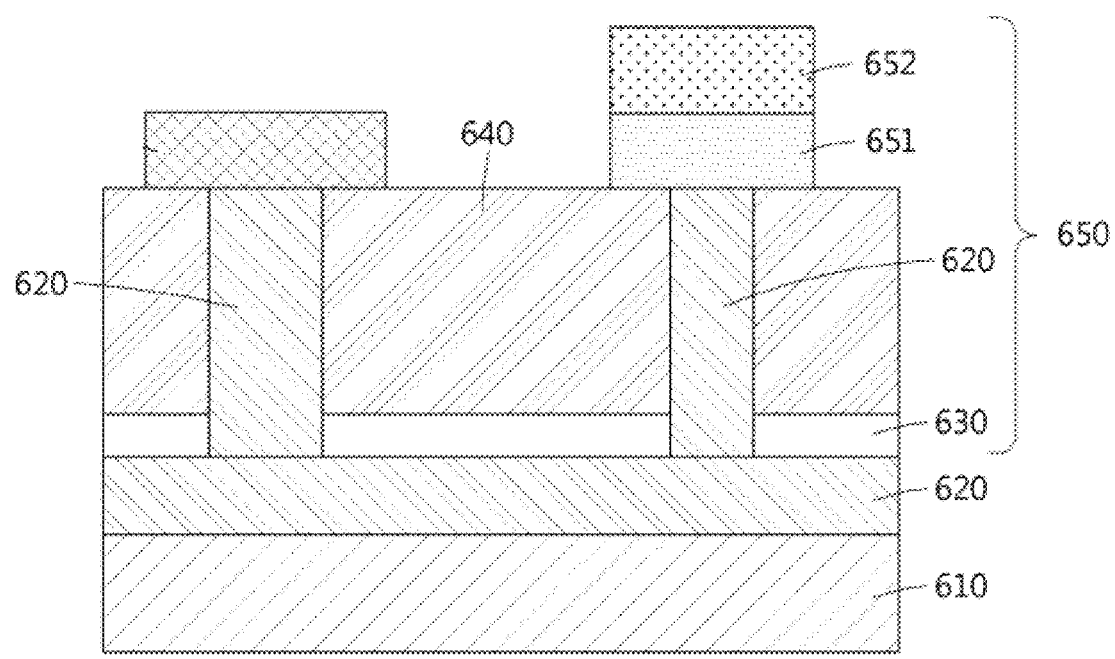
FIG. 6 is a cross-sectional view of the memristor of a synapse included in a neuromorphic system according to an embodiment of the present invention.
Figure 7:
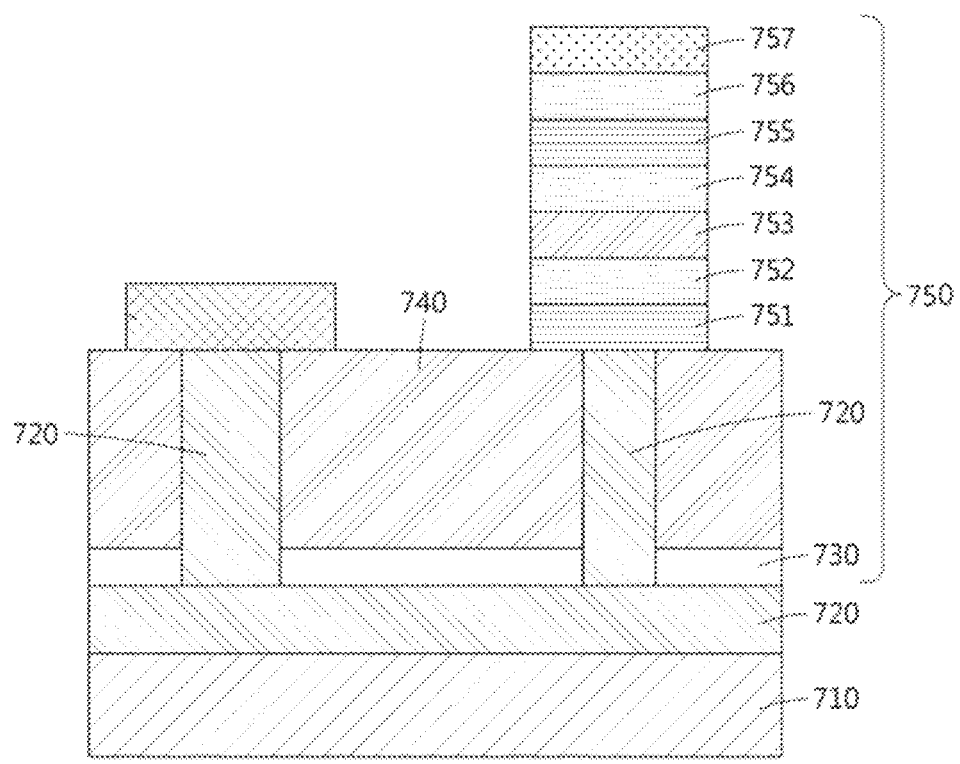
FIG. 7 is a cross-sectional view of the selection device of a synapse included in a neuromorphic system according to an embodiment of the present invention.

FIG. 6 is a cross-sectional view of the memristor of a synapse included in a neuromorphic system according to an embodiment of the present invention, and FIG. 7 is a cross-sectional view of the selection device of a synapse included in a neuromorphic system according to an embodiment of the present invention.

Each of the synapses included in the neuromorphic system according to an embodiment of the present invention may include a memristor 650 and a selection device 750. In FIGS. 6 and 7, for the sake of specific illustration, the memristor 650 and the selection device 750 are respectively formed. However, the memristor 650 and the selection device 750 may be connected in series.

In addition, first electrodes 620 of the memristor 650 may be electrically connected to pre-neurons through wires 620 formed in interlayer insulating layers 610, 630, and 640, a second electrode 652 of the memristor 650 may be electrically connected to the selection device 750, and the selection device 750 may be electrically connected to post-neurons through wires.

Alternatively, first electrodes 720 of the selection device 750 may be electrically connected to pre-neurons through wires 720 formed in interlayer insulating layers 710, 730, and 740, a second electrode 757 of the selection device 750 may be electrically connected to the memristor 650, and the memristor 650 may be electrically connected to post-neurons through wires.

In addition, when the selection device 750 of the synapse included in the neuromorphic system according to an embodiment of the present invention is turned on, an electrical signal may be transmitted to the memristor 650. The electrical signal may allow the memristor 650 to learn so that the resistance state of the memristor 650 may be adjusted, or may be converted into a current value according to the resistance state of the memristor 650. That is, the resistance state of the memristor 650 may be changed by the electrical signal, or a current value according to the resistance state of the memristor 650 may be output by the electrical signal.

Referring to FIG. 6, the memristor 650 of the synapse included in the neuromorphic system according to an embodiment of the present invention may include the first electrodes 620, an insulating layer 651, and the second electrode 652. The wires 620 may be used as contacts and may also be used as the first electrodes 620 of the memristor 650.

The first electrodes 620 and the second electrode 652 of the memristor 650 may be formed of polysilicon doped with impurities, a metal, a conductive metal nitride, or a combination thereof. For example, the first electrodes 620 and the second electrode 652 of the memristor 650 may be formed of W, Pt, WN, Au, Ag, Cu, Al, TiAlN, Ir, Pt, Pd, Ru, Zr, Rh, Ni, Co, Cr, Sn, Zn, ITO, or an alloy thereof or a combination thereof.

In addition, the first electrodes 620 and the second electrode 652 of the memristor 650 may be formed of the same material or different materials.

The insulating layer 651 may include a material, the resistance of which transitions from a high-resistance state to a low-resistance state according to externally applied voltage. For example, the insulating layer 651 may include metal oxides such as amorphous carbon oxide (α-COx), titanium oxide, aluminum oxide, nickel oxide, copper oxide, zirconium oxide, manganese oxide, hafnium oxide, tungsten oxide, tantalum oxide, niobium oxide, and iron oxide.

Referring to FIG. 7, the selection device 750 of the synapse included in the neuromorphic system according to an embodiment of the present invention may include switch layers 751 and 755 formed between the first electrodes 720 and the second electrode 757, a switch layer 753 doped with a metal, and one or more diffusion suppression layers 752, 754, and 756 that are bonded to at least a portion of the surfaces of the switch layers 751 and 755 and the metal-doped switch layer 753.

In addition, the selection device 750 may include one or more of the switch layers 751 and 755 and the metal-doped switch layer 753 formed between the first electrodes 720 and the second electrode 757.

For example, in the selection device 750 of the synapse included in the neuromorphic system according to an embodiment of the present invention, the first electrodes 720, the first switch layer 751, the first diffusion suppression layer 752, the metal-doped switch layer 753, the second diffusion suppression layer 754, the second switch layer 755, the third diffusion suppression layer 756, and the second electrode 757 may be sequentially laminated.

Alternatively, in the selection device 750 of the synapse included in the neuromorphic system according to an embodiment of the present invention, a first metal-doped switch layer, a first diffusion suppression layer, a first switch layer, a second diffusion suppression layer, a second metal-doped switch layer, a third diffusion suppression layer, and a second electrode may be sequentially laminated.

Alternatively, in the selection device 750 of the synapse included in the neuromorphic system according to an embodiment of the present invention, the first metal-doped switch layer, the first diffusion suppression layer, the first switch layer, the second diffusion suppression layer, the second metal-doped switch layer, the third diffusion suppression layer, a second switch layer, a fourth diffusion suppression layer, a third metal-doped switch layer, the fourth diffusion suppression layer, and the second electrode may be sequentially laminated.

The first electrodes 720 and the second electrode 757 of the selection device 750 may be formed of polysilicon doped with impurities, a metal, a conductive metal nitride, or a combination thereof. For example, the first electrodes 720 and the second electrode 757 of the selection device 750 may be formed of W, Pt, WN, Au, Ag, Cu, Al, TiAlN, Ir, Pt, Pd, Ru, Zr, Rh, Ni, Co, Cr, Sn, Zn, ITO, or an alloy thereof or a combination thereof.

The switch layers 751 and 755 may include at least one chalcogen selected from tellurium (Te), selenium (Se), and sulfur(S). In addition, the switch layers 751 and 755 may further include one or more elements selected from boron (B), aluminum (Al), gallium (Ga), carbon (C), silicon (Si), germanium (Ge), nitrogen (N), phosphorus (P), arsenic (As), antimony (Ab), and bismuth (Bi).

Preferably, the switch layers 751 and 755 include germanium selenide (GeSe).

The metal-doped switch layer 753 may include at least one chalcogen selected from tellurium (Te), selenium (Se), and sulfur(S). In addition, the metal-doped switch layer 753 may further include one or more elements selected from boron (B), aluminum (Al), gallium (Ga), carbon (C), silicon (Si), germanium (Ge), nitrogen (N), phosphorus (P), arsenic (As), antimony (Ab), and bismuth (Bi).

In addition, a metal used to dope the metal-doped switch layer 753 may include copper (Cu) or silver (Ag).

Preferably, the metal-doped switch layer 753 may include copper (Cu)-doped germanium selenide (CuGeSe).

A metal nitride may be used to form the diffusion suppression layers 752, 754, and 756. Preferably, titanium nitride (TiN) is used to form the diffusion suppression layers 752, 754, and 756.

In general, in the selection device 750, when a positive voltage is applied to the first electrodes 720 or the second electrode 757, metal cations may diffuse or drift downwards of the metal-doped switch layer 753. When a negative voltage is applied to the first electrodes 720 or the second electrode 757, metal cations may diffuse or drift upwards of the metal-doped switch layer 753.

Accordingly, even when a positive voltage or a negative voltage is applied to the first electrodes 720 or the second electrode 757, a strong metal filament is not formed in the layers of the selection device 750.

However, since the selection device 750 of the synapse included in the neuromorphic system according to an embodiment of the present invention includes the diffusion suppression layers 752, 754, and 756, the concentration distribution of metal cations may be controlled, thereby exhibiting a threshold voltage (Vth) of ~0.65 V and a selection ratio of 107 or more.

Specifically, in the selection device 750 of the synapse included in the neuromorphic system according to an embodiment of the present invention, the metal-doped switch layer 753 and the diffusion suppression layers 752, 754, and 756 that are bonded to at least a portion of the surface of the metal-doped switch layer 753 are formed. Thus, by adjusting the concentration of copper cations to be highest in the metal-doped switch layer 753 and reducing the concentration of copper cations in the switch layers 751 and 755, difference in the copper cation concentrations between the metal-doped switch layer 753 and the switch layers 751 and 755 may be increased, thereby improving selection ratio.

Figure 8:
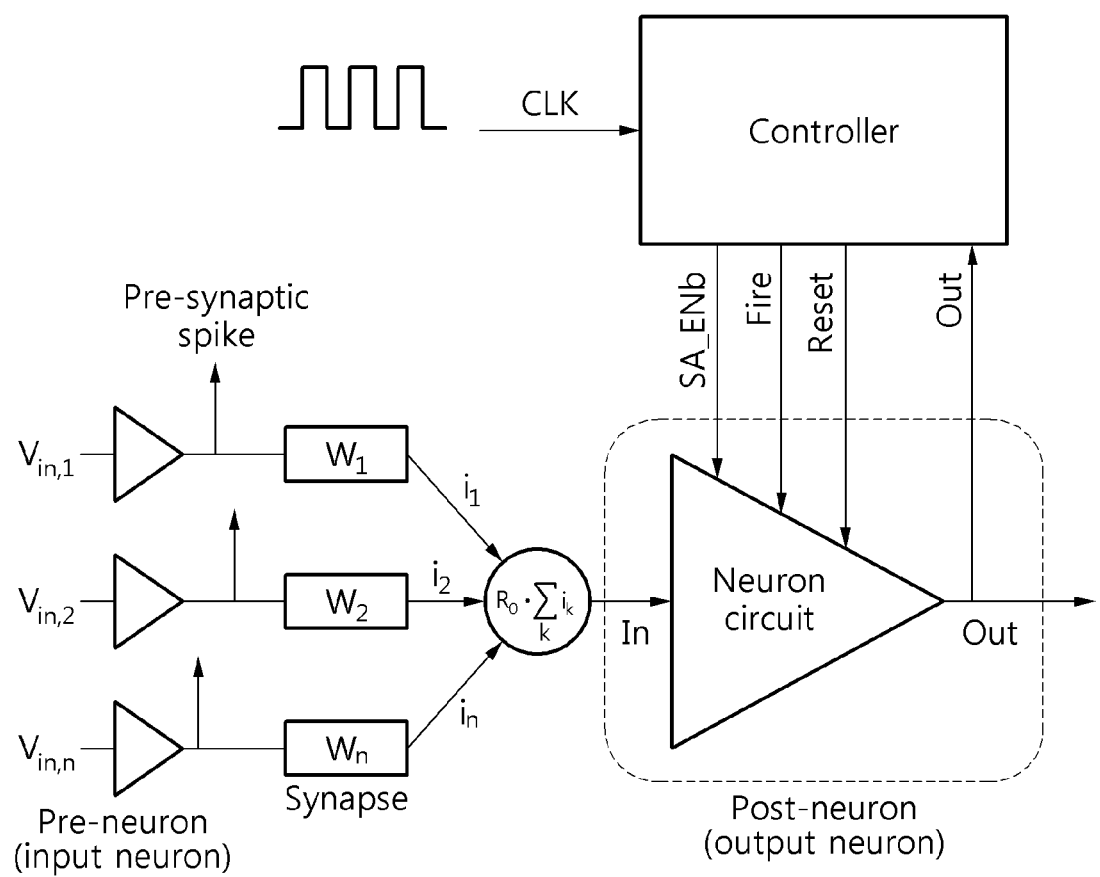
FIG. 8 is a schematic diagram showing the circuit of a neuromorphic system according to an embodiment of the present invention.
Figure 9:
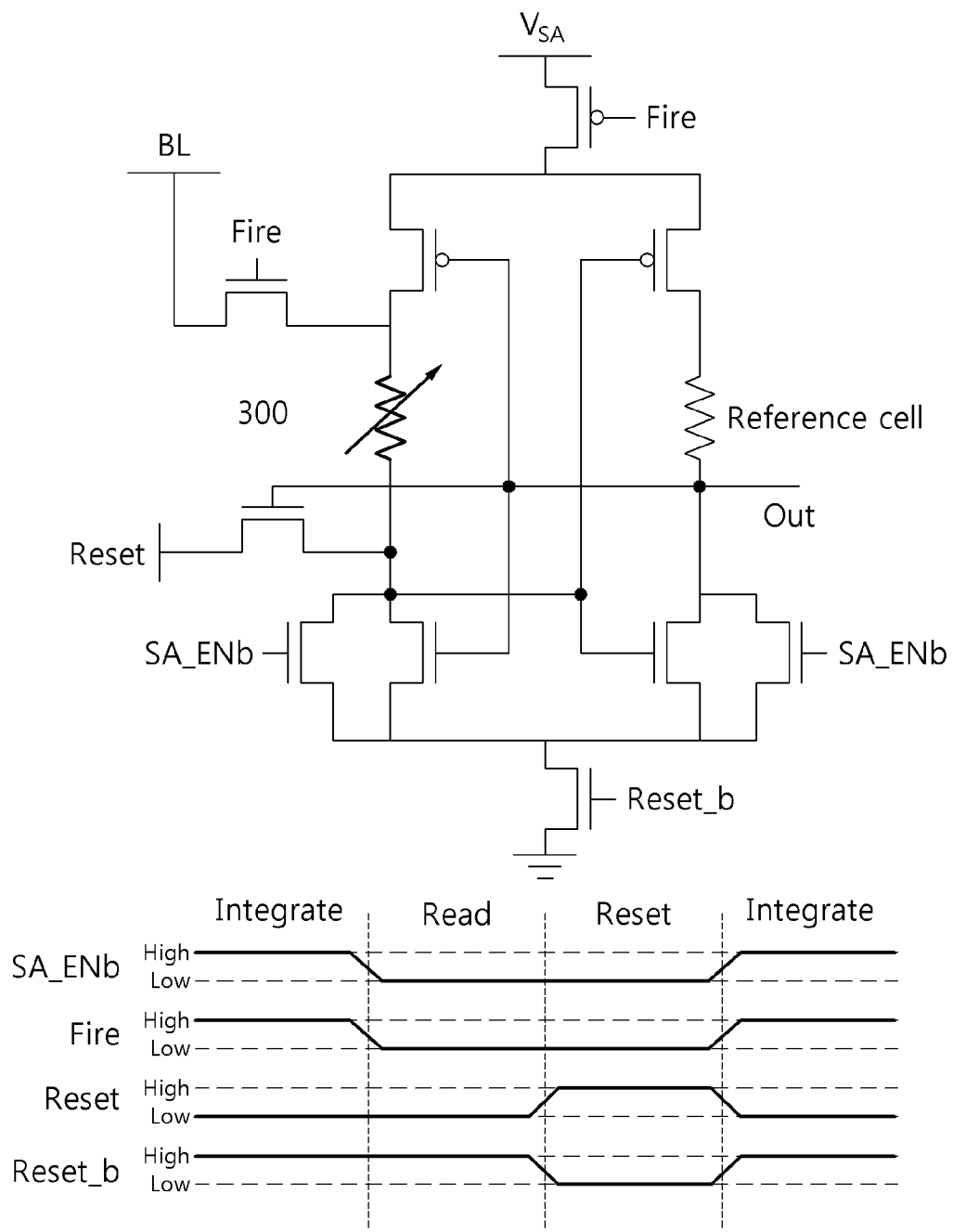
FIG. 9 is a circuit diagram showing the circuit of a neuron according to an embodiment of the present invention.

FIG. 8 is a schematic diagram showing the circuit of a neuromorphic system according to an embodiment of the present invention, and FIG. 9 is a circuit diagram showing the circuit of a neuron according to an embodiment of the present invention.

FIGS. 8 and 9 show synchronous neurons, but the present invention is not limited thereto.

Referring to FIG. 8, the neuromorphic system according to an embodiment of the present invention may include artificial neurons (pre-neurons and post-neurons) and an artificial synapse arrangement. In addition, the neuromorphic system may further include a controller for controlling the artificial neurons (pre-neurons and post-neurons).

Specifically, the post-neurons may be connected to the pre-neurons, and the connection between the post-neurons and the pre-neurons may be mediated via synapses (indicated by W). In addition, when a specific pre-neuron is fired, a voltage pulse (pre-synaptic spike) may be transmitted to the post-neurons through a synapse connected to the fired pre-neuron.

At this time, the amplitude of the pulse may be determined according to the magnitude of the synaptic weight of the synapses connecting the post-neurons and the pre-neurons. When signals are simultaneously input, an adder (circle symbol with sum sign) may sum the signals and may provide the summed signal to the post-neurons. In general, only one neuron may be fired at a time.

In the case of FIG. 8, since the circuit is a synchronous neuron, the circuit may operate according to a clock signal, and the controller may control the post-neurons according to the clock signal.

Referring to FIG. 9, the circuit of the neuron according to an embodiment of the present invention may perform integration, fire, and reset functions according to a control signal at the bottom.

During integration, the SA_ENb fire signal may become high, and a signal (voltage pulse) input to the neuron circuit may be applied to the two-terminal spin device 300a or 300b.

In the next clock, it is determined whether the resistance value of the two-terminal spin device 300a or 300b has reached a threshold value. The Reset_b signal becomes high. At this time, when the resistance value of the two-terminal spin device 300a or 300b has reached a threshold value, the output terminal of the neuron circuit may become high.

When the resistance value does not reach the threshold value, integration may be performed again. When fire occurs, the controller may detect the fire signal and may transmit a reset signal during the next operation.

In a reset operation, a reset signal becomes high, and a voltage with a polarity opposite to that of the integration step is applied to the two-terminal spin device 300a or 300b to reset the resistance value of the two-terminal spin device 300a or 300b.

An additional circuit is required for the neuron included in the neuromorphic system according to an embodiment of the present invention to function as an intact neuron.

Specifically, the circuit of the neuron according to an embodiment of the present invention should be designed to generate an output voltage when the resistance value of the neuron according to an embodiment of the present invention exceeds a certain value, and should include a function to initiate the resistance value for the next operation after the fire operation.

Since the two-terminal spin device 300a or 300b is capable of performing integration, fire and reset functions are additionally required for the two-terminal spin device 300a or 300b to fully function as a neuron.

To perform fire, a comparator capable of confirming whether the resistance value of the two-terminal spin device 300a or 300b has reached a threshold is required. To perform reset, a circuit for detecting fire and applying voltage for resetting to the two-terminal spin device 300a or 300b is required.

FIG. 9 shows an example of a neuron circuit, and comparison of resistance may be implemented using a sense amplifier. Reset may be implemented by using an additional transistor. When reset is required, the controller may apply a signal to the gate of the reset transistor.

Figure 10A:
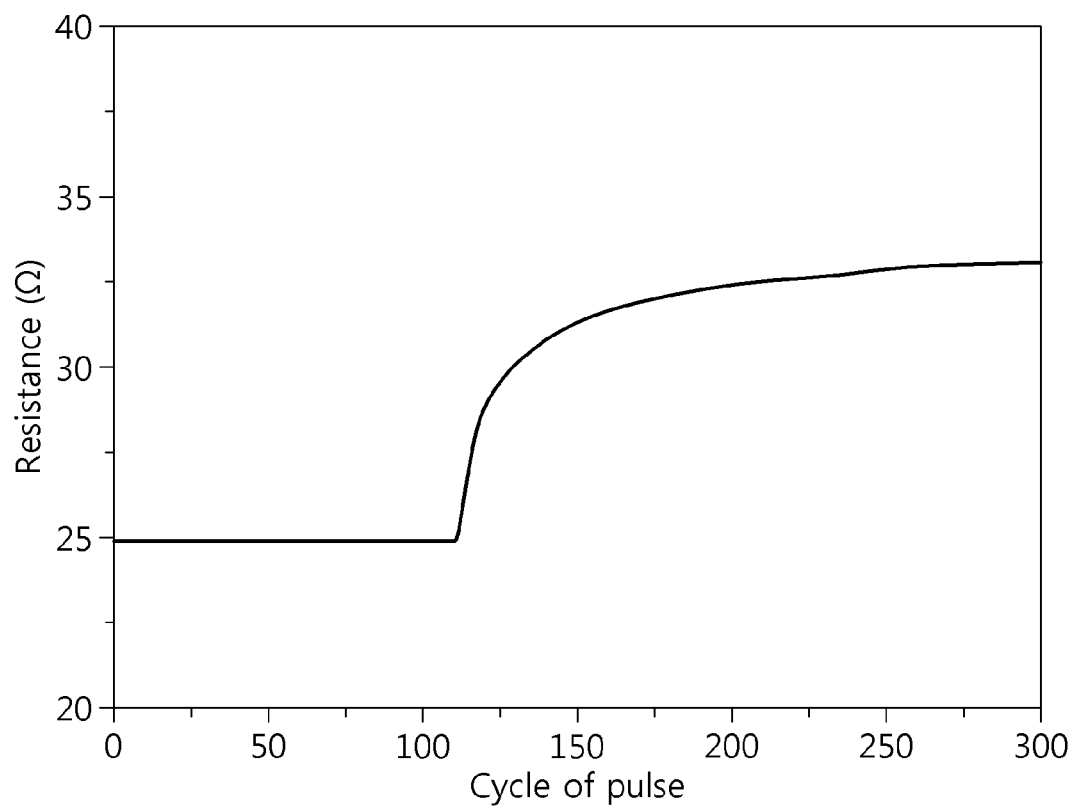
FIG. 10A is a graph showing integration and fire characteristics when a constant voltage pulse is repeatedly applied to a neuron according to an embodiment of the present invention.

FIG. 10A is a graph showing integration and fire characteristics when a constant voltage pulse is repeatedly applied to a neuron according to an embodiment of the present invention.

Referring to FIG. 10A, when a constant voltage pulse is repeatedly applied to the neuron according to an embodiment of the present invention, a section in which the neuron according to an embodiment of the present invention gradually transitions from a low-resistance state to a high-resistance state is observed, and the resistance value of the neuron is gradually saturated.

Accordingly, it can be seen that a state in which resistance gradually increases indicates integration, and a state in which resistance reaches a specific threshold resistance (Rth) indicates fire.

Figure 10B:
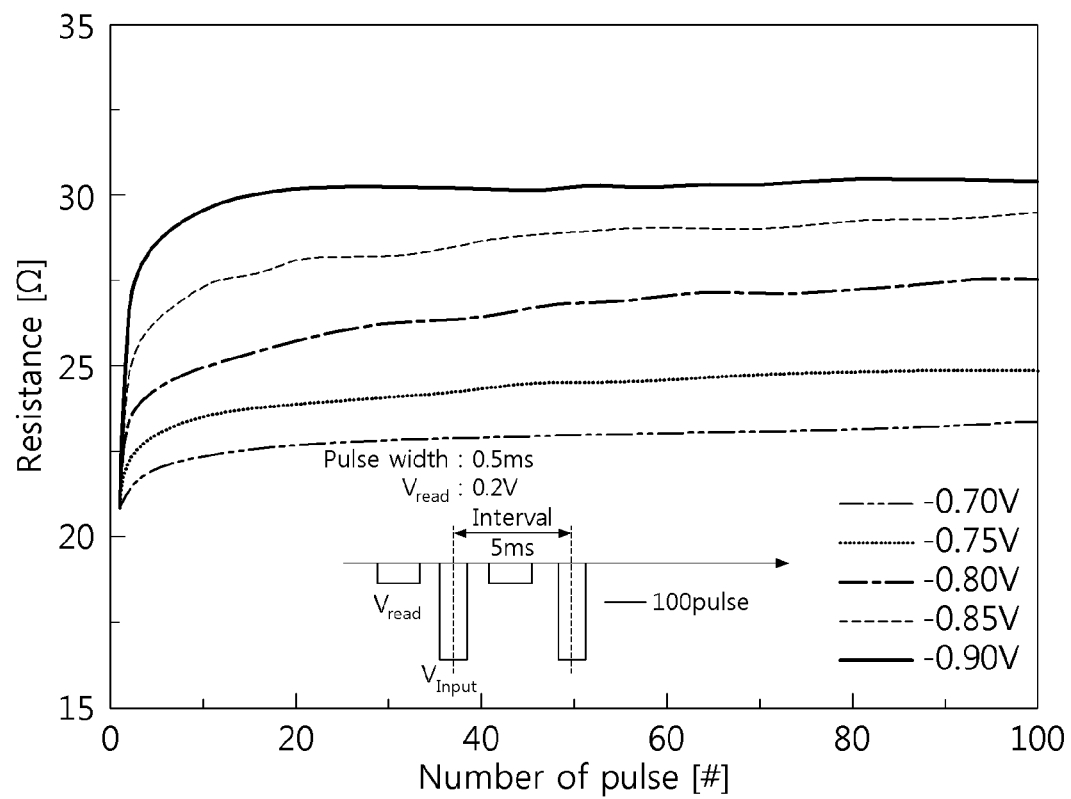
FIG. 10B is a graph showing integration and fire characteristics according to pulse amplitudes (voltage amplitudes) when a constant voltage pulse is repeatedly applied to a neuron according to an embodiment of the present invention.

FIG. 10B is a graph showing integration and fire characteristics according to pulse amplitudes (voltage amplitudes) when a constant voltage pulse is repeatedly applied to a neuron according to an embodiment of the present invention.

Referring to FIG. 10B, the integration and fire of the neuron according to an embodiment of the present invention are clearly observed at various pulse amplitudes. In particular, as the pulse amplitude increases, the integration and fire of the neuron according to an embodiment of the present invention become more distinct.

Figure 11A:
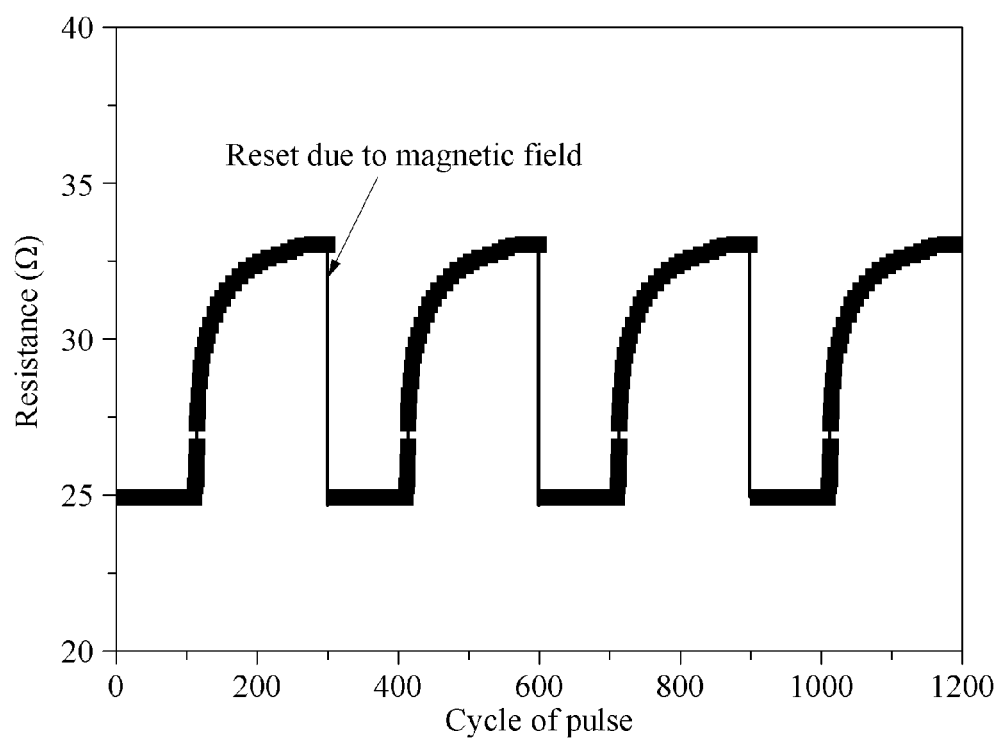
FIG. 11A is a graph showing the repeat integration/fire and reset characteristics of a neuron according to an embodiment of the present invention.
Figure 11B:
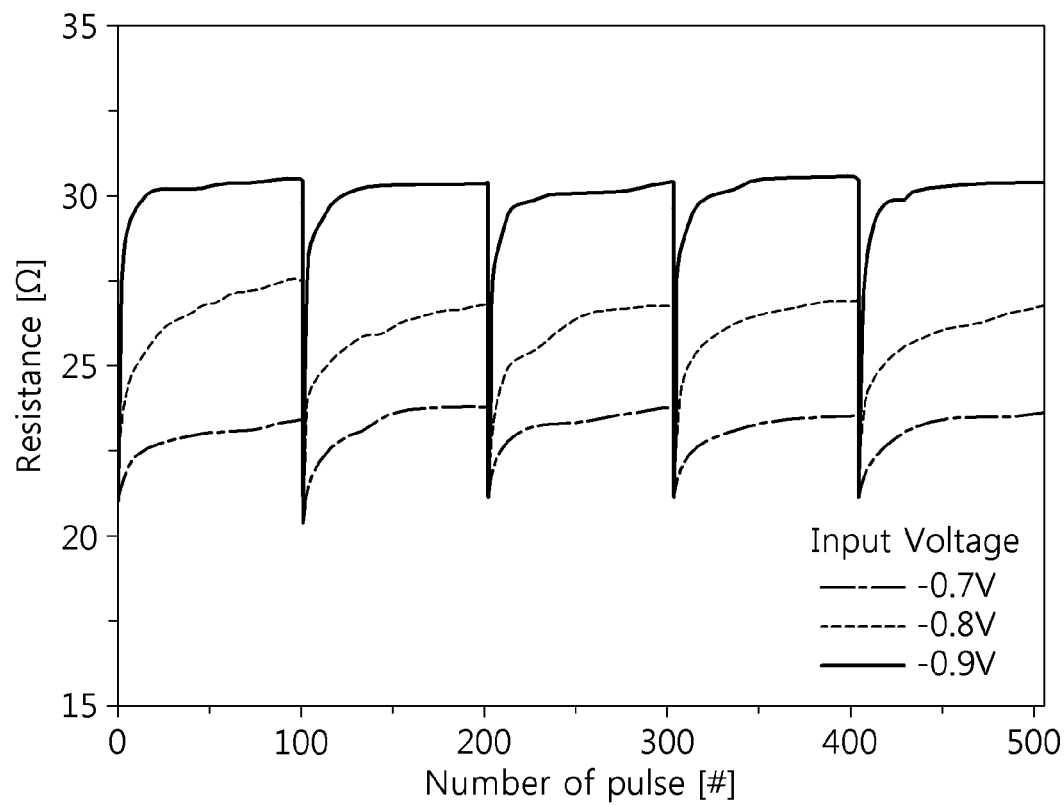
FIG. 11B is a graph showing the repeat integration/fire and reset characteristics of a neuron according to an embodiment of the present invention according to pulse amplitudes (voltage amplitudes).

FIG. 11A is a graph showing the repeat integration/fire and reset characteristics of a neuron according to an embodiment of the present invention, and FIG. 11B is a graph showing the repeat integration/fire and reset characteristics of a neuron according to an embodiment of the present invention according to pulse amplitudes (voltage amplitudes).

Referring to FIGS. 11A and 11B, in the neuron according to an embodiment of the present invention, repeat integration/fire and reset are repeatedly observed. In particular, as the pulse amplitude increases, the integration/fire and reset of the neuron according to an embodiment of the present invention become more distinct.

Figure 12:
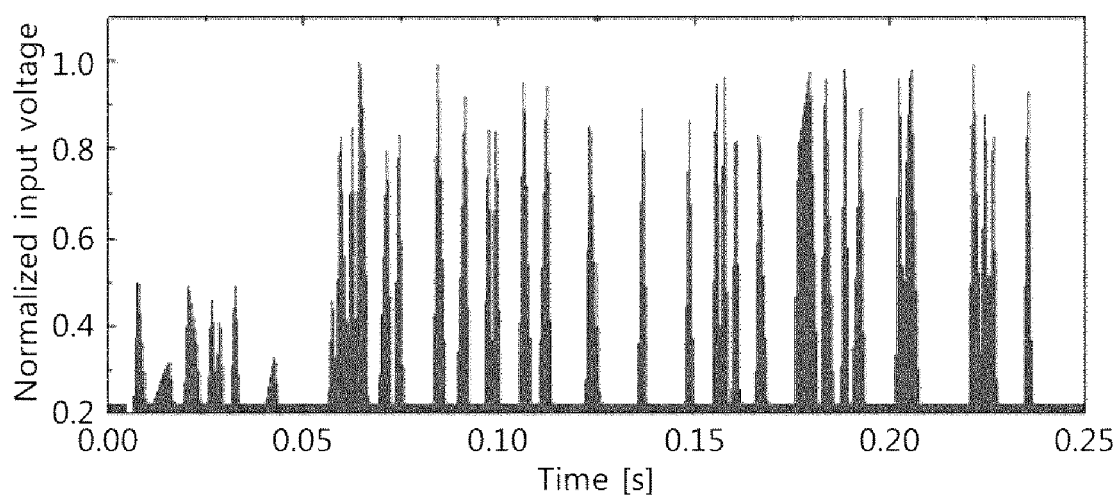
FIG. 12 is a graph showing the random pulses of a neuron according to an embodiment of the present invention.
Figure 13:
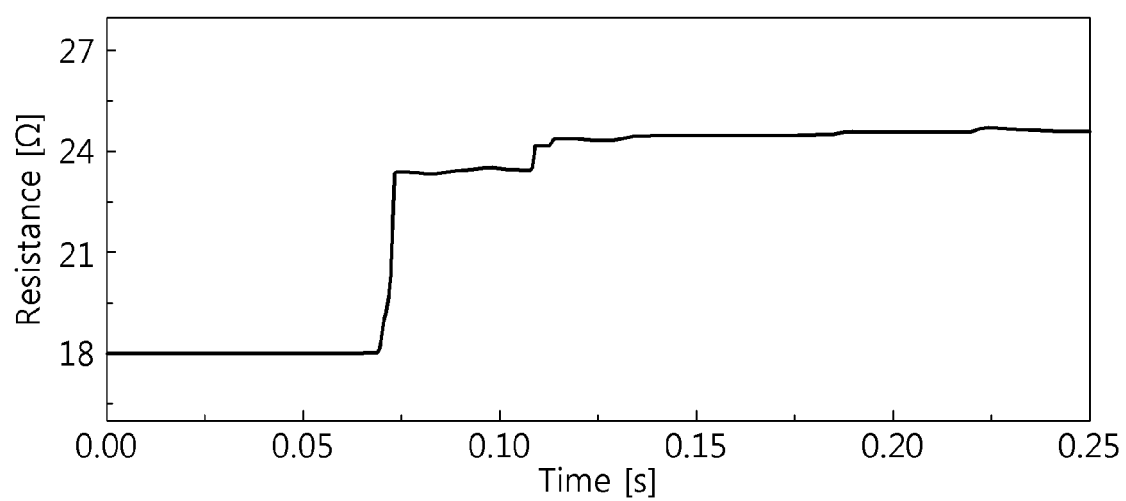
FIG. 13 is a graph showing the integration and fire of a neuron according to an embodiment of the present invention according to random pulses shown in FIG. 12.

FIG. 12 is a graph showing the random pulses of a neuron according to an embodiment of the present invention, and FIG. 13 is a graph showing the integration and fire of a neuron according to an embodiment of the present invention according to random pulses shown in FIG. 12.

In FIG. 13, random pulses as shown in FIG. 12 are applied to the neuron according to an embodiment of the present invention.

Referring to FIG. 13, it can be seen that, even when random pulses are applied to the neuron according to an embodiment of the present invention, integration and fire are clearly observed.

Figure 14:
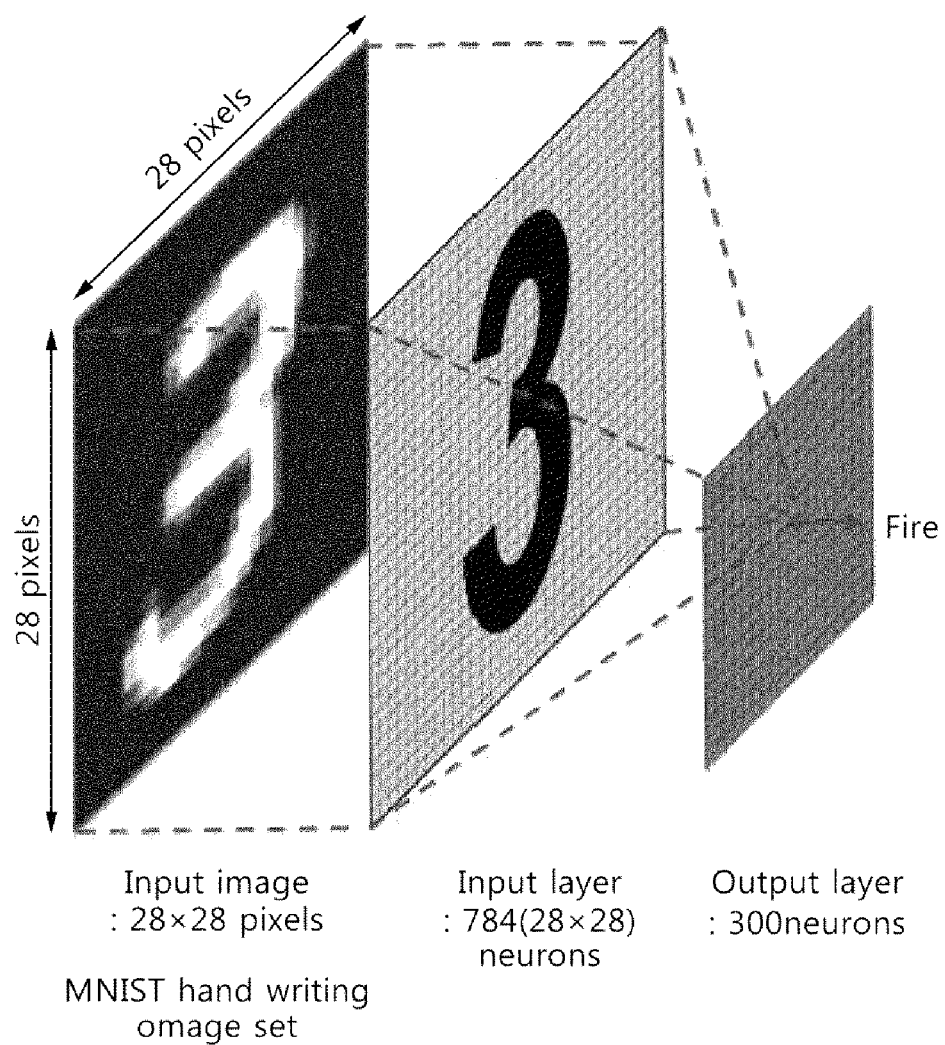
FIG. 14 is a schematic diagram showing a single-layer spiking neural network (SNN).

FIG. 14 is a schematic diagram showing a single-layer spiking neural network (SNN).

Referring to FIG. 14, the neuromorphic system according to an embodiment of the present invention was simulated as a single-layer spiking neural network (SNN) consisting of 784 input neurons and 300 output neurons.

For recognition rate test using the simulated neuromorphic system according to an embodiment of the present invention, the MNIST image set was used, and the spike timing dependent plasticity (STDP) learning rule was used for learning. At this time, it was assumed that the characteristics of synapses were ideal.

Figure 15:
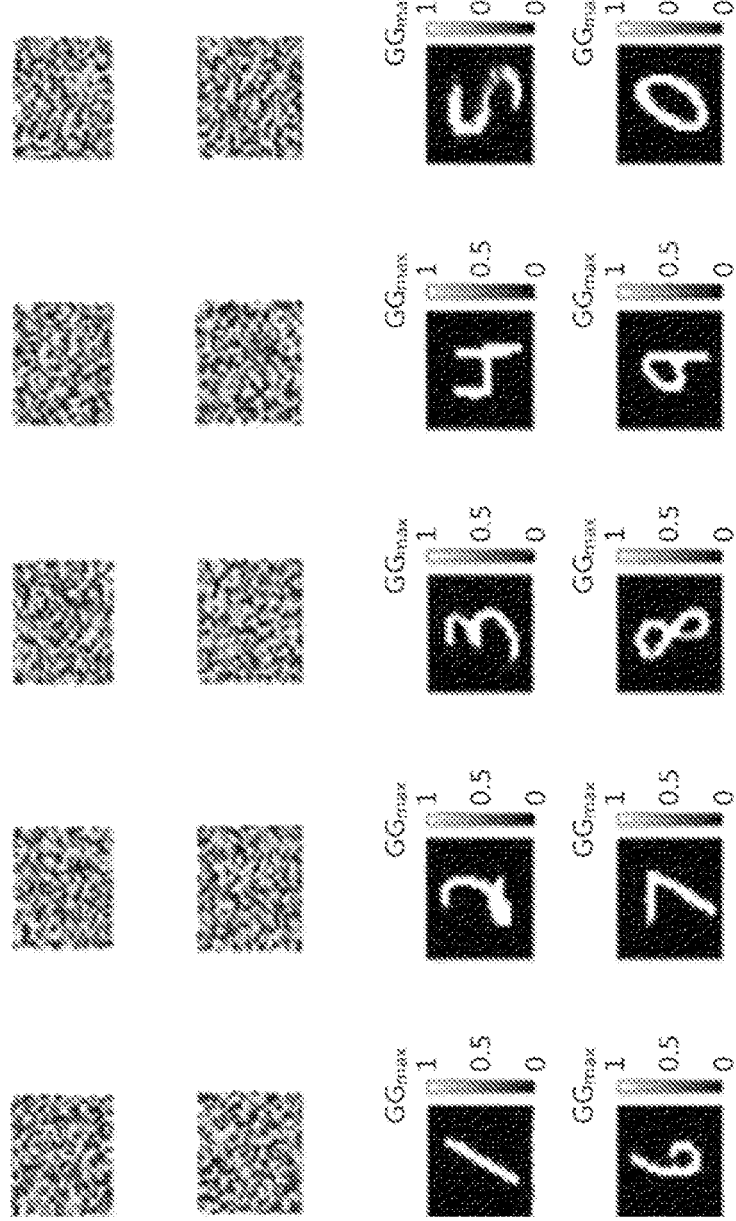
FIG. 15 includes images showing the weights of synapses after learning is complete.

FIG. 15 includes images showing the weights of synapses after learning is complete.

In FIG. 15, the simulated neuromorphic system according to an embodiment of the present invention according to FIG. 14 is used.

Referring to FIG. 15, in the simulated neuromorphic system according to an embodiment of the present invention, the weights of synapses after learning show accurate results as in FIG. 12.

Figure 16:
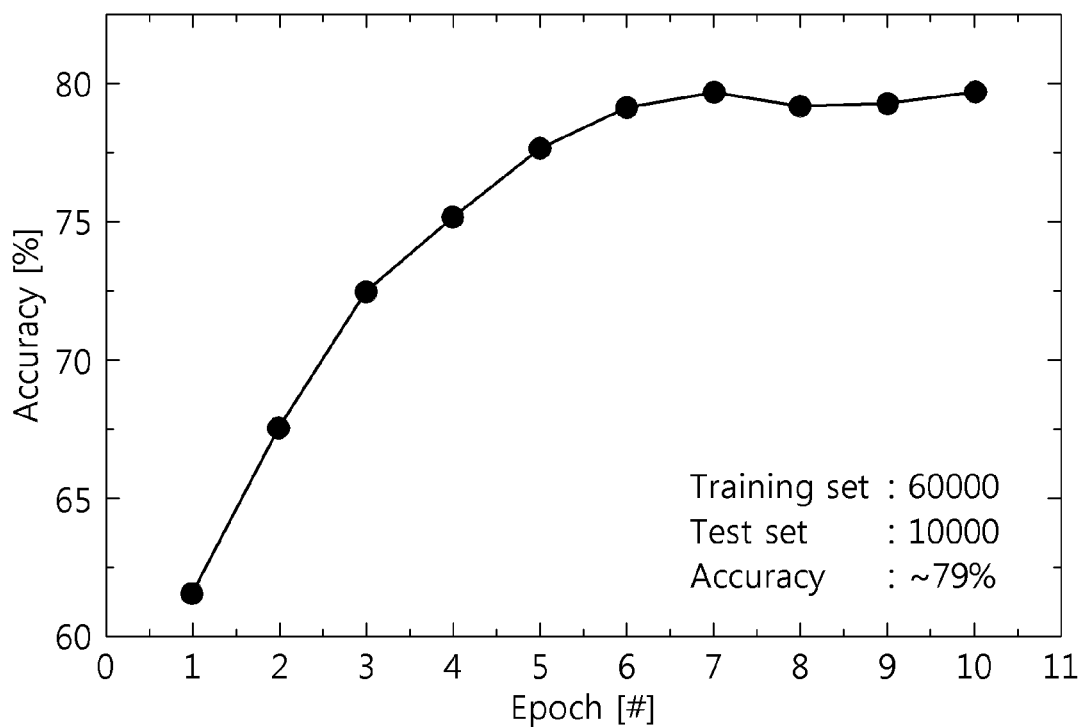
FIG. 16 shows image recognition accuracy according to the number of learning.

FIG. 16 shows image recognition accuracy according to the number of learning.

In FIG. 16, the simulated neuromorphic system according to an embodiment of the present invention shown in FIG. 14 was used.

In the simulated neuromorphic system according to an embodiment of the present invention, recognition rate according to learning progress gradually increases, and a maximum recognition rate of up to 79% is observed.

Figure 17A:
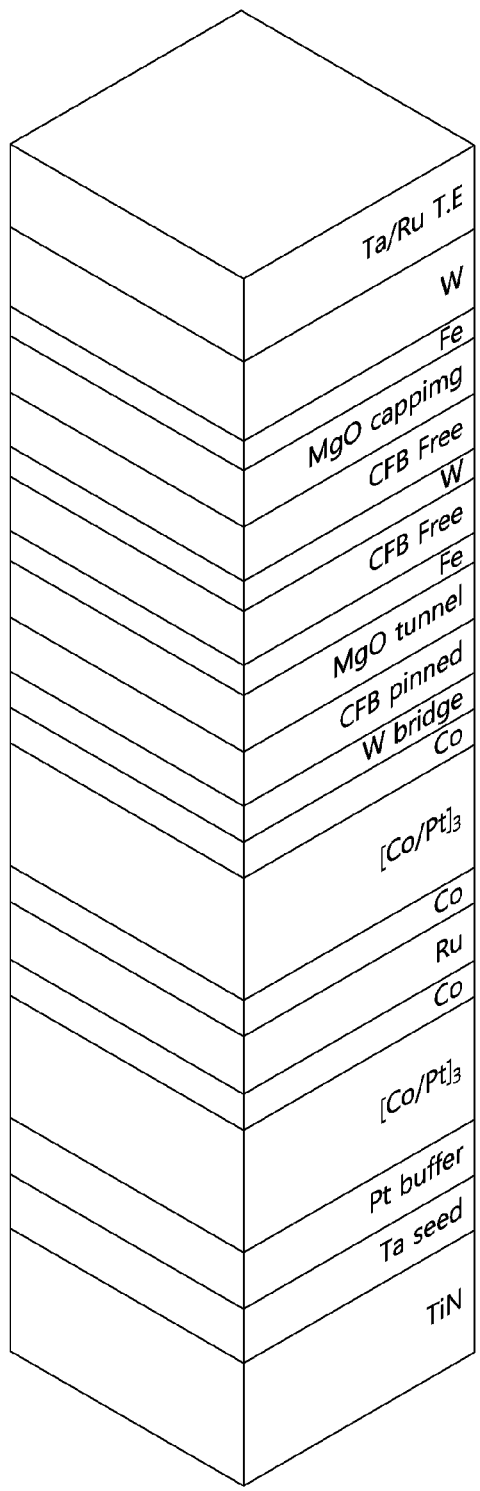
FIG. 17A is a schematic diagram showing an example of a two-terminal spin device included in the neuron according to an embodiment of the present invention, FIG. 17B includes a graph showing the magnetic moments of a two-terminal spin device included in the neuron according to an embodiment of the present invention according to magnetic fields and a graph showing the magnetic moments of the two-terminal spin device included in the neuron according to an embodiment of the present invention according to magnetic fields in a small magnetic field range (−500 to +500 Oe)
Figure 17B:
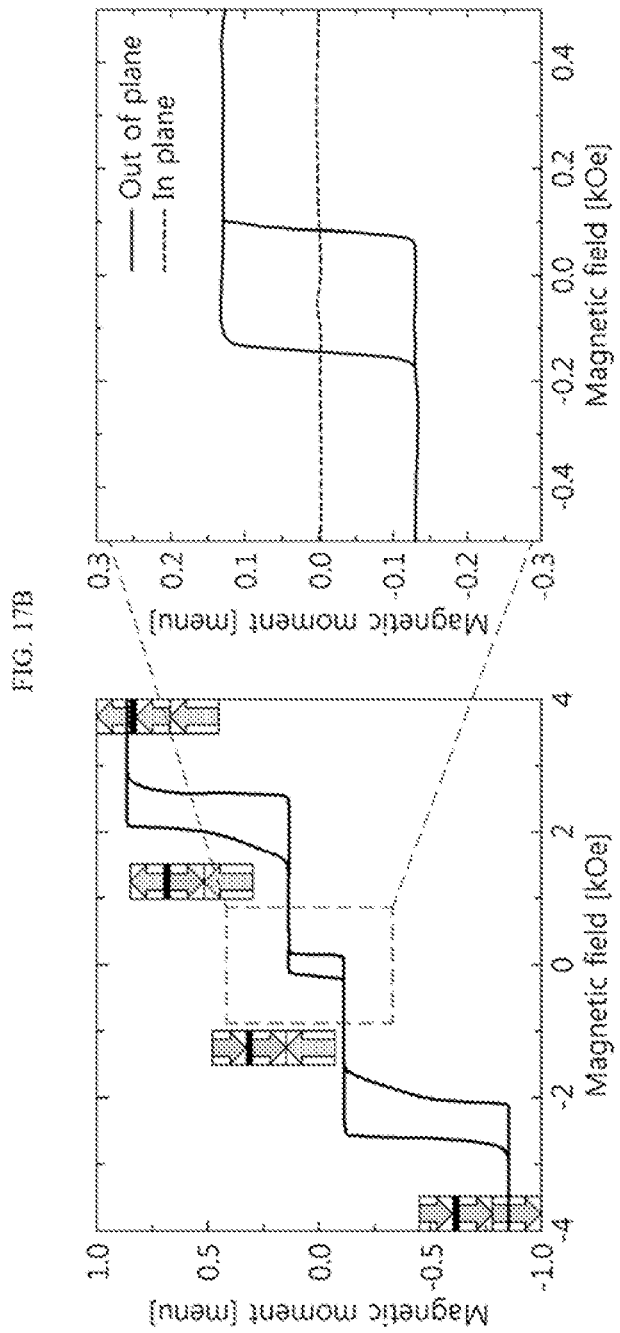
FIG. 17C is a graph showing the resistance of a two-terminal spin device included in the neuron according to an embodiment of the present invention according to magnetic fields in a small magnetic field range (−500 to +500 Oe)
FIG. 17D is a graph showing the resistance of a two-terminal spin device included in the neuron according to an embodiment of the present invention according to voltages.
Figure 17C:
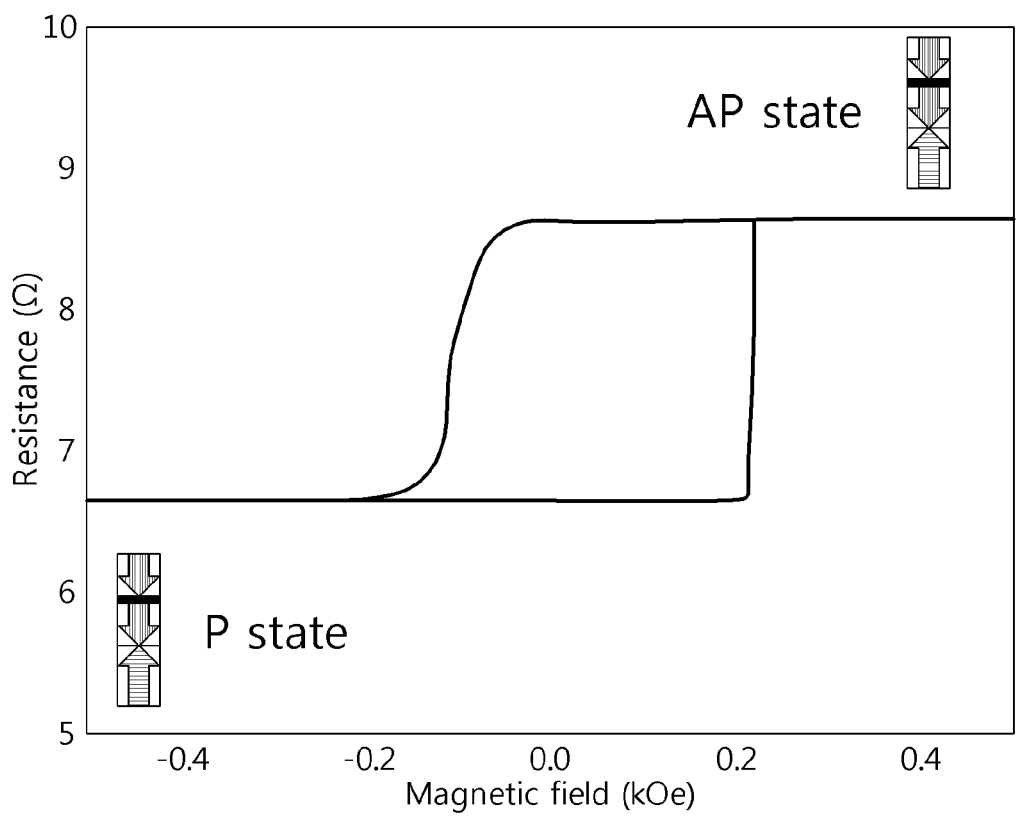
Figure 17D:
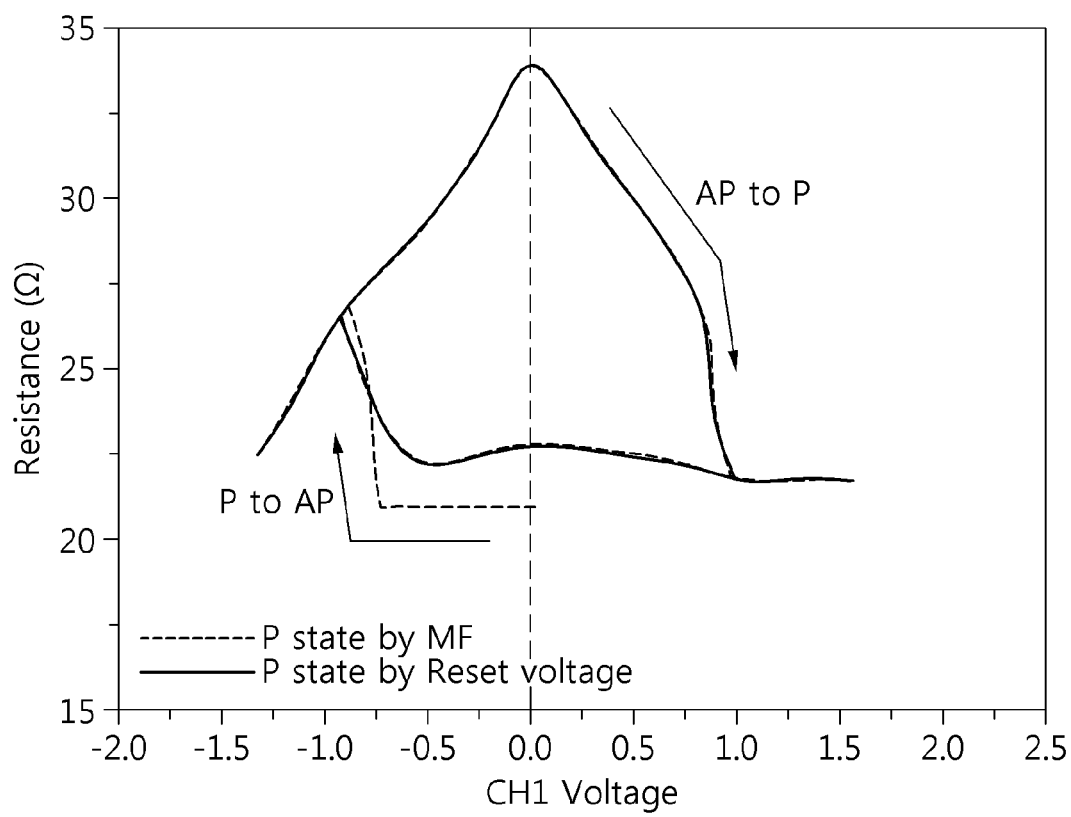

FIG. 17A is a schematic diagram showing an example of a two-terminal spin device included in the neuron according to an embodiment of the present invention, FIG. 17B includes a graph showing the magnetic moments of a two-terminal spin device included in the neuron according to an embodiment of the present invention according to magnetic fields and a graph showing the magnetic moments of the two-terminal spin device included in the neuron according to an embodiment of the present invention according to magnetic fields in a small magnetic field range (−500 to +500 Oe), FIG. 17C is a graph showing the resistance of a two-terminal spin device included in the neuron according to an embodiment of the present invention according to magnetic fields in a small magnetic field range (−500 to +500 Oe), and FIG. 17D is a graph showing the resistance of a two-terminal spin device included in the neuron according to an embodiment of the present invention according to voltages.

For example, the two-terminal spin device included in the neuron according to an embodiment of the present invention may be fabricated as shown in FIG. 17A.

Referring to FIGS. 17B to 17D, in the two-terminal spin device included in the neuron according to an embodiment of the present invention, the spin direction of each magnetic layer exhibits vibration sample magnetometer (VSM) by an external magnetic field.

In particular, in the two-terminal spin device included in the neuron according to an embodiment of the present invention, the spin direction of the free layer (CoFeB Free) in a small magnetic field range (−500 to +500 Oe) may be confirmed.

Meanwhile, embodiments of the present invention disclosed in the present specification and drawings are only provided to aid in understanding of the present invention and the present invention is not limited to the embodiments. It will be apparent to those skilled in the art that various modifications can be made to the above-described exemplary embodiments of the present invention without departing from the spirit and scope of the invention.

The invention claimed is:

1. A neuron, comprising:
a two-terminal spin device configured to:
perform integration and fire without leaking; and
have a negative differential resistance (NDR) region in which current decreases as voltage increases,
wherein the neuron does not leak,
wherein the two-terminal spin device includes two or more resistance states that are distinct from each other and are electrically reversible,
wherein an I-V curve of the two-terminal spin device is provided with a region in which the current decreases as the voltage increases,
wherein, when voltage is applied to the two-terminal spin device, the two-terminal spin device transitions from a low-resistance state to a high-resistance state, allowing the integration to be performed,
wherein the low-resistance state is under a threshold resistance state,
wherein the high-resistance state is over the threshold resistance state, and
wherein the integration is a process in which an electrical signal input through one or more synapses is integrated as a potential.

2. The neuron according to claim 1, wherein the voltage applied is a pulse.

3. The neuron according to claim 1, wherein the fire is a process in which an accumulated potential reaches a threshold and an electrical signal is output to adjacent neurons.

4. The neuron according to claim 3, wherein the two-terminal spin device is further configured to perform the fire based on a resistance reaching a threshold resistance (Rth) while the integration is performed.

5. The neuron according to claim 1, wherein the two-terminal spin device comprises a bottom electrode, a seed layer, a pinning layer, a pinned layer, a tunnel barrier layer, a free layer, and a top electrode.

6. A neuromorphic system, comprising:
a neuron;
one or more pre-neurons;
one or more synapses electrically connected to the one or more pre-neurons; and
one or more post-neurons electrically connected to the one or more synapses and each comprising a two-terminal spin device,
wherein the one or more post-neurons are configured to perform integration and fire without leaking, and
wherein the neuron does not leak,
wherein the two-terminal spin device has a negative differential resistance (NDR) region in which current decreases as voltage increases and includes two or more resistance states that are distinct from each other and are electrically reversible,
wherein an I-V curve of the two-terminal spin device is provided with a region in which the current decreases as the voltage increases,
wherein, when voltage is applied to the two-terminal spin device, the two-terminal spin device transitions from a low-resistance state to a high-resistance state, allowing the integration to be performed,
wherein the low-resistance state is under a threshold resistance state,
wherein the high-resistance state is over the threshold resistance state,
wherein the integration is a process in which an electrical signal input through one or more synapses is integrated as a potential.

7. The neuromorphic system according to claim 6, wherein the one or more synapses have a cross-bar array structure.

8. The neuromorphic system according to claim 6, wherein each of the one or more synapses comprises a memristor and a selection device.

9. The neuromorphic system according to claim 6, further comprising a controller.

10. The neuromorphic system according to claim 9, wherein the controller is configured to reset the one or more post-neurons.

* * * * *